US009318397B2

(12) United States Patent
Yamaoka et al.

(10) Patent No.: US 9,318,397 B2
(45) Date of Patent: Apr. 19, 2016

(54) STACKED SEMICONDUCTOR CHIPS INCLUDING TEST CIRCUITRY

(71) Applicant: Hitachi, Ltd., Chiyoda-ku, Tokyo (JP)

(72) Inventors: Masanao Yamaoka, White Plains, NY (US); Kenichi Osada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 366 days.

(21) Appl. No.: 14/095,859

(22) Filed: Dec. 3, 2013

(65) Prior Publication Data

US 2014/0159041 A1 Jun. 12, 2014

Related U.S. Application Data

(62) Division of application No. 13/388,990, filed as application No. PCT/JP2009/066040 on Sep. 14, 2009, now Pat. No. 8,653,645.

(51) Int. Cl.
*H01L 21/66* (2006.01)
*H01L 23/528* (2006.01)
*H01L 25/065* (2006.01)
*H01L 25/18* (2006.01)
*H01L 23/50* (2006.01)

(52) U.S. Cl.
CPC ............ *H01L 22/30* (2013.01); *H01L 23/5286* (2013.01); *H01L 25/0652* (2013.01); *H01L 25/0657* (2013.01); *H01L 25/18* (2013.01); *H01L 23/50* (2013.01); *H01L 2225/06513* (2013.01); *H01L 2225/06541* (2013.01); *H01L 2924/0002* (2013.01)

(58) Field of Classification Search
USPC .................................................. 257/48, 777
IPC ......................................... H01L 22/34,25/0657
See application file for complete search history.

(56) References Cited

U.S. PATENT DOCUMENTS

| 6,566,848 B2 | 5/2003 | Horigan et al. |
| 2005/0082664 A1* | 4/2005 | Funaba ................. H01L 23/544 257/724 |
| 2008/0253085 A1 | 10/2008 | Soffer |
| 2008/0290341 A1 | 11/2008 | Shibata |
| 2010/0059898 A1* | 3/2010 | Keeth ................... H01L 25/0657 257/777 |
| 2010/0085825 A1* | 4/2010 | Keeth ...................... G11C 5/02 365/200 |

FOREIGN PATENT DOCUMENTS

| JP | 2007-150208 A | 6/2007 |
| JP | 2008-004853 A | 1/2008 |
| JP | 2008-96312 A | 4/2008 |

* cited by examiner

*Primary Examiner* — Marcos D Pizarro
(74) *Attorney, Agent, or Firm* — Miles & Stockbridge P.C.

(57) ABSTRACT

A semiconductor device includes: a first circuit block formed on a first semiconductor substrate having first and second sides extending in a first direction and third and fourth sides extending in a second direction intersecting with the first direction; a plurality of signal-line through vias that are connected to the first semiconductor substrate and transmit signals, which are output from the first circuit block, to a second circuit block formed on another second semiconductor substrate; and a plurality of power-supply through vias for supplying power to the first circuit block, and in the semiconductor device, the plurality of power-supply through vias are formed at edges of the first semiconductor substrate along the third and fourth sides and are formed in a plurality of rows in the first direction. Each circuit block has a power consuming mode in which power larger than the power consumption in a normal mode is consumed.

6 Claims, 29 Drawing Sheets

● : POWER-SUPPLY THROUGH VIA
○ : SIGNAL-LINE THROUGH VIA

■ : POWER-SUPPLY THROUGH VIA
□ : SIGNAL-LINE THROUGH VIA

● : POWER-SUPPLY THROUGH VIA
○ : SIGNAL-LINE THROUGH VIA

● : POWER-SUPPLY THROUGH VIA
○ : SIGNAL-LINE THROUGH VIA

■ : POWER-SUPPLY THROUGH VIA   ■ : POWER-SUPPLY METAL BUMP
□ : SIGNAL-LINE THROUGH VIA    ▭ : SIGNAL-LINE METAL BUMP

● : POWER-SUPPLY THROUGH VIA
○ : SIGNAL-LINE THROUGH VIA
── : UPPERMOST-LAYER WIRING
•••••• : WIRING IN LAYER BELOW UPPERMOST LAYER

● : VDD THROUGH VIA
○ : VSS THROUGH VIA

● : POWER-SUPPLY THROUGH VIA
○ : SIGNAL-LINE THROUGH VIA

■ : POWER-SUPPLY THROUGH VIA
□ : SIGNAL-LINE THROUGH VIA

● : POWER-SUPPLY THROUGH VIA
○ : SIGNAL-LINE THROUGH VIA

■ : POWER-SUPPLY THROUGH VIA
□ : SIGNAL-LINE THROUGH VIA

● : POWER-SUPPLY THROUGH VIA
○ : SIGNAL-LINE THROUGH VIA

■ : POWER-SUPPLY THROUGH VIA
□ : SIGNAL-LINE THROUGH VIA

● : VDD THROUGH VIA
○ : VSS THROUGH VIA

● : VDD THROUGH VIA
○ : VSS THROUGH VIA

VDD
VSS

● : VDD THROUGH VIA
○ : VSS THROUGH VIA

VSS WIRING
VDD WIRING

● : VDDH THROUGH VIA
◉ : VDDL THROUGH VIA
○ : VSS THROUGH VIA

VSS
VDDL
VSS
VDDH

- ● : VDDH THROUGH VIA
- ◉ : VDDL THROUGH VIA
- ○ : VSS THROUGH VIA

― UPPERMOST-LAYER WIRING
······· WIRING IN LAYER BELOW UPPERMOST LAYER

● : POWER-SUPPLY THROUGH VIA
○ : SIGNAL-LINE THROUGH VIA

■ : POWER-SUPPLY THROUGH VIA
□ : SIGNAL-LINE THROUGH VIA

● : POWER-SUPPLY THROUGH VIA
○ : SIGNAL-LINE THROUGH VIA

■ : POWER-SUPPLY THROUGH VIA
□ : SIGNAL-LINE THROUGH VIA

● : POWER-SUPPLY THROUGH VIA
○ : SIGNAL-LINE THROUGH VIA

● : POWER-SUPPLY THROUGH VIA
○ : SIGNAL-LINE THROUGH VIA

● : POWER-SUPPLY THROUGH VIA
○ : SIGNAL-LINE THROUGH VIA

OUTER SHAPE OF CHIP H
OUTER SHAPE OF CHIP G

● : POWER-SUPPLY THROUGH VIA
○ : SIGNAL-LINE THROUGH VIA

● : POWER-SUPPLY THROUGH VIA

☐ : SIGNAL-COMMUNICATION COIL

CPU CHIP
CPU CHIP
MEMORY CHIP
MEMORY CHIP

■ : POWER-SUPPLY THROUGH VIA

━ : SIGNAL-COMMUNICATION COIL

● : POWER-SUPPLY THROUGH VIA
○ : SIGNAL-LINE THROUGH VIA

■ : POWER-SUPPLY THROUGH VIA
☐ : SIGNAL-LINE THROUGH VIA

FIG. 38

RSLT_TBL

| LSI | PROCESSOR CORE | OPERATION AVAILABILITY |
|---|---|---|
| LSI_A | PU_A0 | 1 |
| LSI_B | PU_B0 | 1 |
|  | PU_B1 | 1 |
|  | PU_B2 | 1 |
|  | PU_B3 | 1 |
|  | IP_B0 | 1 |
|  | IP_B1 | 1 |
| LSI_C | PU_C0 | 0 |
|  | PU_C1 | 0 |
|  | PU_C2 | 0 |
|  | PU_C3 | 0 |
|  | IP_C0 | 0 |
|  | IP_C1 | 0 |

US 9,318,397 B2

STACKED SEMICONDUCTOR CHIPS INCLUDING TEST CIRCUITRY

TECHNICAL FIELD

The present invention relates to a semiconductor device in which a plurality of semiconductor integrated circuits are three-dimensionally integrated by using through silicon vias (TSV).

BACKGROUND ART

Recently, in a semiconductor integrated circuit (LSI: Large Scale Integrated Circuit), the amount of the circuits integrated in one chip has been increased and the performance of the circuits has also been improved along with the further miniaturization in the semiconductor manufacturing processes. However, when chips are sealed in a package and the package is mounted on a board, communication performance is degraded due to the long communication distance between the chips, and the communication performance cannot catch up with the performance improvement in the chips. Moreover, due to the influence of, for example, miniaturization limit and increase in the cost to use most-advanced processes, the conventional performance improvement by the integration onto one chip will not always be the most optimum solution in the future.

As a technique for improving the performance between chips, Patent Document 1 discloses the technique of three-dimensionally stacking a plurality of chips and connecting the respective chips by using through silicon vias to carry out inter-chip communication. Also, Patent Document 2 introduces the technique of finding out short-circuit fault of through electrodes used for signals.

PRIOR ART DOCUMENTS

Patent Documents

Patent Document 1: Japanese Unexamined Patent Application Publication No. 2008-4853
Patent Document 2: Japanese Unexamined Patent Application Publication No. 2008-96312

SUMMARY OF THE INVENTION

Problems to be Solved by the Invention

When a plurality of chips are three-dimensionally stacked in the above-described manner to carry out communication between the chips by TSVs, the communication distance between the chips can be shortened, and the performance degradation due to the communication between the chips can be suppressed. In this case, since the circuits in the chips operate at high speed, the power consumed by each of the chips is comparatively large, and the power has to be sufficiently supplied to each of the chips. When the chips are not three-dimensionally integrated like the conventional case, since there is a limit to the power consumed by one chip, the power can be supplied through the wiring between the chips and the package substrate on which the chips are disposed. However, in the case where the chips are three-dimensionally integrated, the larger the number of stacked chips, the larger the supplied power. Therefore, many TSVs for power supply have to be also prepared. However, when TSVs are used, since the holes that penetrate through silicon substrates of LSI have to be formed and the metal wirings that penetrate through the chips have to be formed, it is difficult to dispose a comparatively large-scale circuit such as a CPU or an on-chip memory around the through vias. Therefore, it is necessary to study the efficient methods to dispose the many prepared TSVs for power supply.

Furthermore, in the case where chips are three-dimensionally stacked, one type of chips are stacked in some cases and several types of chips, that is, different chips such as processor chips and memory chips are stacked in other cases. In this case, it is difficult to employ the disposition of the through vias that is optimized for the circuits mounted on the respective chips.

Also, when a fault occurs in the through silicon via for power supply, the stacked LSIs do not operate at all or abnormal operations occur. Furthermore, if the number of fault occurrence is small with respect to the overall number of electrodes, abnormal operations may occur only in a particular operating state of the LSI. In the conventional method for testing the power supply of LSI, the test is carried out by abutting a probe against an electrode exposed from the surface of a wafer during the manufacturing process. However, the test method of the stacked LSIs connected by through silicon vias, in particular, the test method of the connection state of the through silicon vias has the point that has not been expected in the conventional test method. More specifically, in a conventional device test method for only one side of a silicon wafer, the test is carried out by abutting a probe against the electrode exposed from the surface of the wafer. However, as a matter of course, in the case of stacked LSIs using through vias, the test can be carried out only after stacking. Therefore, the electrodes of the LSI in a lower layer are hidden by the LSI in an upper layer, and the test by abutting the probe cannot be carried out. Also, in the method introduced in Patent Document 2 that finds out the short-circuit fault between the through electrodes used for signals and an LSI substrate, disconnection faults of through electrodes and contact failures between the through electrodes that occur after stacking a plurality of LSIs cannot be detected. If disconnection faults or contact faults occur, necessary and sufficient power cannot be supplied and operation faults occur. Therefore, it is necessary to inspect also the presence of these faults.

Furthermore, the stacked-type semiconductor devices are developed to various products by changing the number of stacked chips having the same configuration. Therefore, when a test is to be carried out from the outside of the device, the procedure of the test has to be changed depending on the number of the stacked chips, and there is a problem that inspection processes become complicated.

Therefore, an object of the present invention is to supply sufficient power to three-dimensionally stacked LSI chips and to dispose a common through via to the chips of different types. Also, another object thereof is to propose a new test method for through silicon vias for power supply.

Means for Solving the Problems

A typical semiconductor device according to the present invention is as follows. First, with respect to the disposition of power-supply through vias, the semiconductor device includes: a first circuit block formed on a first semiconductor substrate having first and second sides extending in a first direction and third and fourth sides extending in a second direction intersecting with the first direction; a plurality of signal-line through vias that are connected to the first semiconductor substrate and transmit signals, which are output from the first circuit block, to a second circuit block formed on another second semiconductor substrate; and a plurality of power-supply through vias for supplying power to the first circuit block, and the plurality of power-supply through vias are formed at edges of the first semiconductor substrate along the third and fourth sides and are formed in a plurality of rows in the first direction.

Also, with respect to a test of power-supply through vias, the semiconductor device includes: a first LSI including a first processing unit and a first power-supply test circuit, the first processing unit having a normal mode and a power consuming mode; a second LSI stacked with the first LSI and including a second processing unit and a second power-supply test circuit, the second processing unit having the normal mode and the power consuming mode; and a power-supply through via that connects the first LSI and the second LSI and supplies an operating voltage to the first LSI and the second LSI, and power consumption of the first processing unit in the power consuming mode is larger than power consumption of the first processing unit in the normal mode, power consumption of the second processing unit in the power consuming mode is larger than power consumption of the second processing unit in the normal mode, when the first processing unit is in the power consuming mode, the first power-supply test circuit measures a voltage value of the operating voltage supplied via the power-supply through via, and when the second processing unit is in the power consuming mode, the second power-supply test circuit measures a voltage value of the operating voltage supplied via the power-supply through via.

Effects of the Invention

According to the present invention, power can be reliably supplied to stacked LSIs.

BRIEF DESCRIPTIONS OF THE DRAWINGS

FIG. 38 is a drawing showing the configuration of the table which records the power-supply test results in the semiconductor device according to the present invention;

BEST MODE FOR CARRYING OUT THE INVENTION

Embodiment 1

Embodiment 1-1

Figure 1:
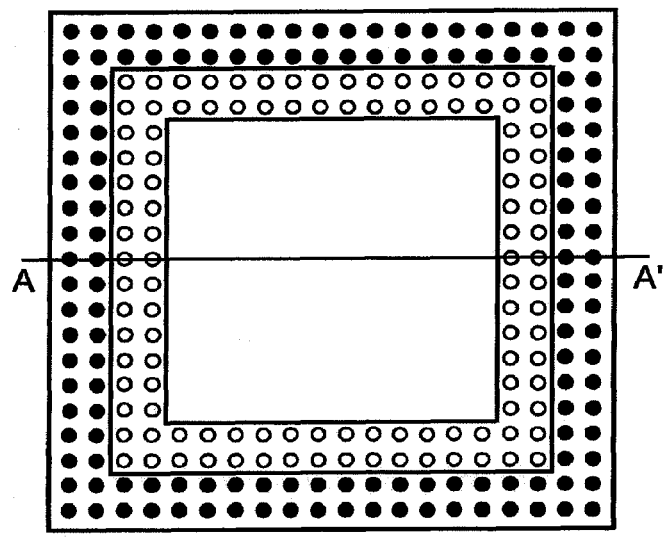
FIG. 1 is a schematic drawing of the disposition of TSVs of the stacked LSIs to which the present invention is applied.
Figure 2:
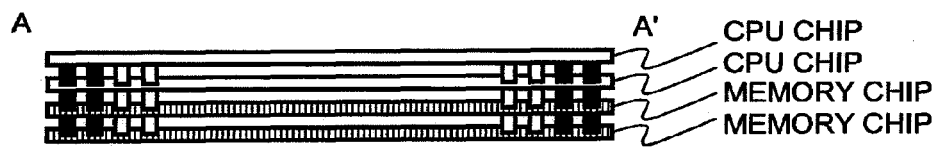
FIG. 2 is a cross-sectional view of the stacked LSIs to which the present invention is applied.
Figure 7:
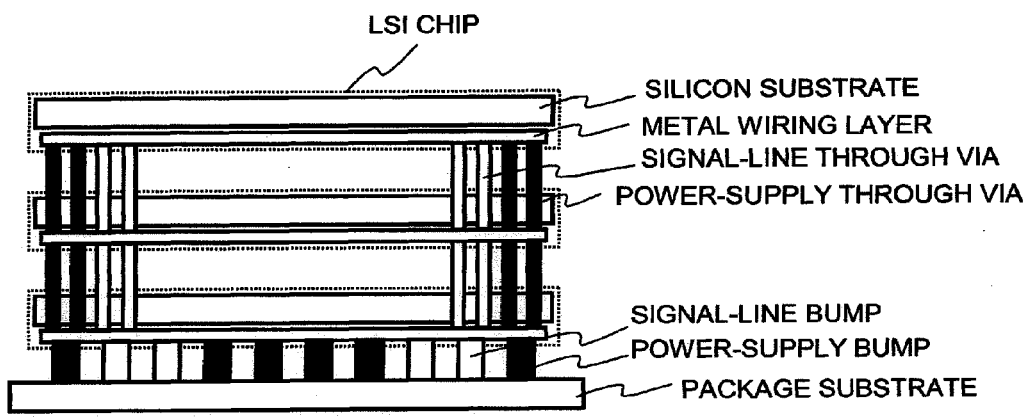
FIG. 7 is a cross-sectional view of the stacked LSIs to which the present invention is applied.

FIG. 1 shows a schematic drawing of the disposition of through silicon vias (TSVs) of three-dimensionally stacked LSIs using the present invention. In FIG. 1, black circles represent power-supply TSVs for supplying power to stacked chips, and white circles represent signal-line TSVs which transmit signals between the stacked chips. The power-supply TSVs are disposed in a plurality of rows in an outer peripheral part of the chips, and the signal-line TSVs are disposed inside them. FIG. 2 shows the cross-sectional structure in which two CPU chips on which a plurality of CPUs (Central Processing Units) are mounted and two memory chips on which memory arrays are mounted are stacked by using this TSV disposing configuration. FIG. 2 is the cross section of the chips of FIG. 1 taken along the line A-A'. The power-supply TSVs and the signal-line TSVs connecting the respective chips are disposed at the same locations in the vertical direction. Each of the chips is stacked so that a metal wiring layer is directed downward, and the TSVs are connected to a metal wiring layer of the chip stacked thereabove, penetrate through a silicon layer of the chip stacked therebelow, and are connected to a metal wiring layer of the chip stacked therebelow. FIG. 7 shows this state. Here, the lowermost chip is connected to a package substrate. In this case, the metal wiring layer of the lowermost chip is directed downward in order to shorten the distance of the signal lines between the chip and the package substrate, and the metal wiring layers of all the stacked chips are directed downward in conformity to it.

Figure 3:
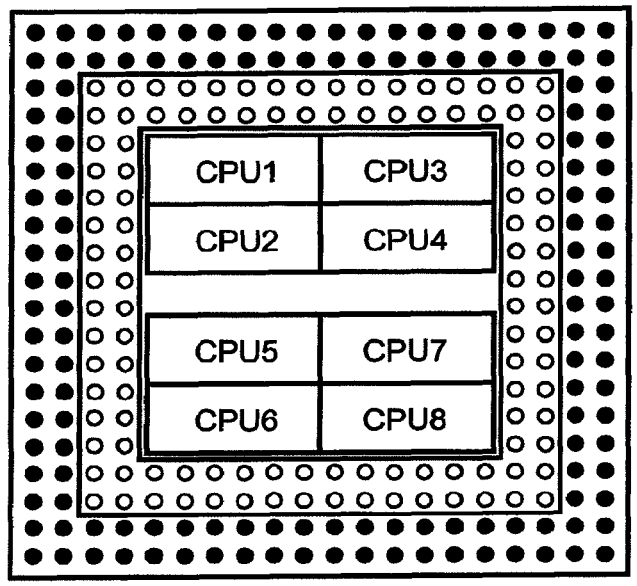
FIG. 3 is a schematic drawing of the disposition of TSVs and circuits of the stacked LSIs to which the present invention is applied.

FIG. 3 shows an example of the disposition of TSVs and the disposition of CPUs in the CPU chip using the present invention. In this LSI chip, eight CPU cores CPU 1 to 8 are integrated. The TSVs for power supply and signal lines are disposed in the peripheral part of the chip, and the CPUs are disposed at a center part of the chip. In this manner, circuit blocks such as CPUs are disposed in the region in which the TSVs are not located.

Figure 4:
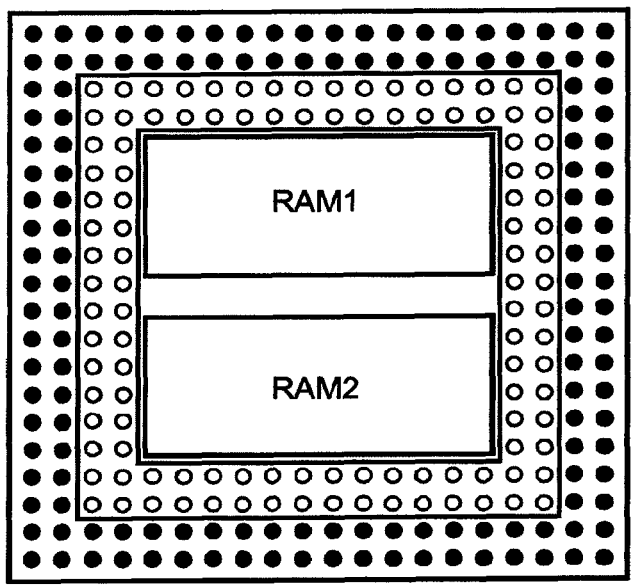
FIG. 4 is a schematic drawing of the disposition of TSVs and circuits of the stacked LSIs to which the present invention is applied.

FIG. 4 shows an example of the disposition of TSVs and the disposition of memories in the memory chip using the present invention. The TSVs for power supply and signal lines are disposed in the peripheral part of the chip, and a RAM 1 and a RAM 2 serving as memory arrays are disposed at a center part of the chip. In this manner, circuit blocks such as memories are disposed in the region in which the TSVs are not located.

In these cases, a first point common to FIG. 3 and FIG. 4 is that the power-supply TSVs are disposed in a plurality of rows in the outermost periphery of the chips. By collectively disposing the power-supply TSVs in the plurality of rows in the outermost periphery in this manner, necessary power can be supplied. Moreover, since they are disposed in the outermost periphery, the circuit blocks and the signal-line TSVs can be freely disposed and laid out inside them. A second point is that the power-supply TSVs are disposed in the outermost periphery of the chips and the signal-line TSVs are disposed between the power-supply TSVs and the circuit blocks. The reason why the power-supply TSVs and the signal-line TSVs are disposed in the outer periphery of the circuit blocks is to ensure a large region for disposing the circuit blocks, and the reason why the signal-line TSVs are disposed on the inner side of the power-supply TSVs is to shorten the distances between the circuit blocks and the signal-line TSVs and to take into account the stacking of the chips of different types as described later.

Figure 5:
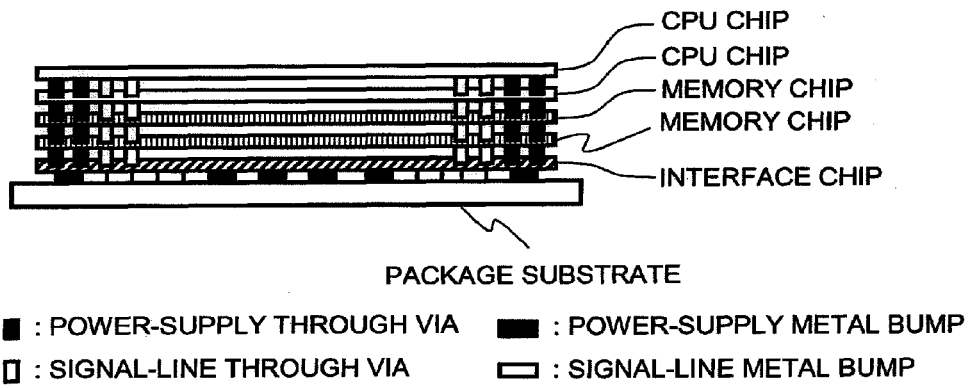
FIG. 5 is a cross-sectional view of the stacked LSIs to which the present invention is applied.

FIG. 5 shows a cross section of two CPU chips, two memory chips, an interface chip for connecting LSI to a package substrate, and the package substrate. In this drawing, LSI chips and the package substrate are connected to each other by metal bumps. In the present embodiment, metal wiring of an upper layer of the chip stacked above is connected to TSVs, and the TSVs are formed to penetrate through the silicon of the chip stacked therebelow and are connected to metal wiring of an upper layer of the lower chip. Therefore, the metal wiring of the upper layer of each of the chips is designed to have the shape that is connected to the TSVs. In other words, in the example of FIG. 5, if the two memory chips are formed to have the same shape, the metal wiring of the upper layer of the memory chip on the lower side has the structure to be connected to the TSVs. Normally, in order to dispose many TSVs, the pitch between the TSVs is narrower than the wiring pitch of the package substrate. Therefore, it is difficult to connect the metal bumps for the connection to the package substrate directly to the TSVs. Therefore, the interface chip is inserted between the memory chip of the lowermost layer and the package substrate, and the metal wiring thereof is designed to have the shape that can be connected to the TSVs and the metal bumps, whereby the stacked CPU chips and memory chips and the package substrate can be mutually connected. In other words, in the interface chip, the wiring for bump connection can be formed by extending the wiring of the uppermost layer from the TSVs provided in the outer periphery to the inner side. Furthermore, in the case where this structure is employed, if a circuit having an interface for connecting signals to the outside such as DDR or PCI is mounted on the interface chip, communication with the outside can be carried out with a protocol such as DDR or PCI even when interface circuits for connection to the outside are not mounted on the individual memory chips. In the present invention, since the signal TSVs are provided on the inner side of the power-supply TSVs, the distances between the bumps used for the connection to the package substrate and the signal TSVs can be shortened. In the case where the pitches of the TSVs and the metal bumps are equal, the case where the TSVs and the metal bumps can be connected by the same metal wiring structure, or the case where the chip of the lowermost layer can be designed to have the wiring structure corresponding to the metal bumps, the stacked LSI chips and the package substrate can be mutually connected without inserting the interface chip.

Figure 6:
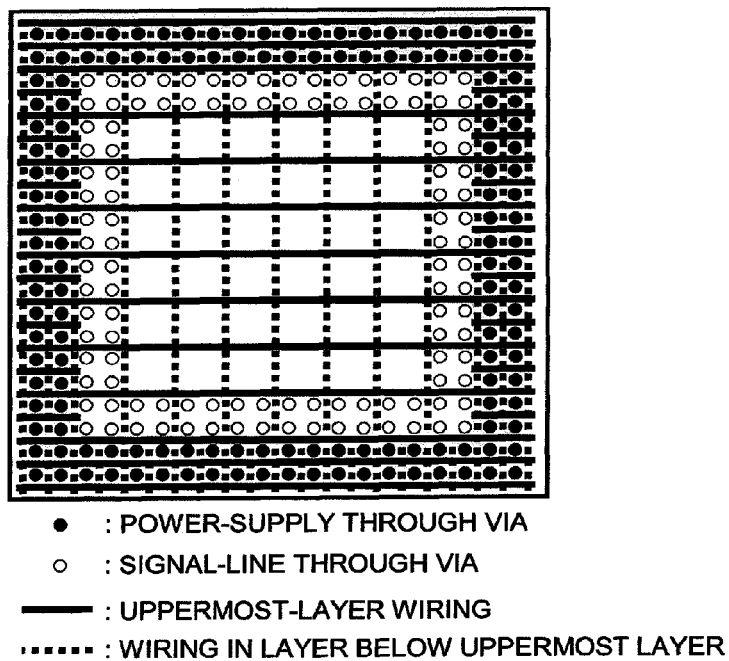
FIG. 6 is a schematic drawing of power supply wirings of the stacked LSIs to which the present invention is applied.

FIG. 6 shows a disposition example of power-supply wirings connected to TSVs of LSI chips using the present invention. The power-supply wiring is made up of power-supply wiring extending in a first direction (in this drawing, the transverse direction) in a wiring layer of an uppermost layer and power-supply wiring extending in a second direction (in this drawing, the longitudinal direction) in a wiring of a lower layer, and it is laid out in a mesh shape by mutually connecting the upper and lower power-supply wirings at intersection points or at arbitrary intersection points. In this case, since only the power-supply TSVs are disposed in the outermost periphery of the chips, the wiring for power supply can occupy the metal wiring, and the resistance value thereof can be reduced. The power-supply wirings that pass through the center part of the chips are configured so as to have an interval therebetween, for example, one out of every two wirings is laid out through the central part. By this means, signal wiring for signal-line TSVs provided on the inner side of the power-supply TSVs can be easily laid out. A metal wiring layer connected to TSVs is required in the upper-layer wiring of the chip in order to be connected to the upper side of the TSVs and also required in the lower-layer wiring of the chip in order to be connected to the lower side of the TSVs, which penetrate through silicon. Since the lower-layer wiring of the chip is used also for normal wiring, there is a demand that the occupation rate of the region in which operating circuits are located is desired to be reduced as much as possible. If the power-supply TSVs are disposed in the chip outer peripheral part like the present invention, the density of the power-supply wirings can be increased in the part connected to the TSVs and the density of the power-supply wirings can be reduced and the signal wirings can be laid out in the part in which operating circuits such as CPU circuits are disposed.

FIG. 7 shows a cross-sectional view showing the connection of LSI chips, a package substrate, TSVs, and metal bumps using the present invention. The TSVs are connected to metal wiring of an upper layer of the chip stacked above, penetrate through the silicon part of the chip stacked below, and are connected to metal wiring of a lower layer of the chip. Each of the bumps connects the metal wiring of the upper layer of the chip stacked in the lowermost layer and the package substrate.

Figure 8A:
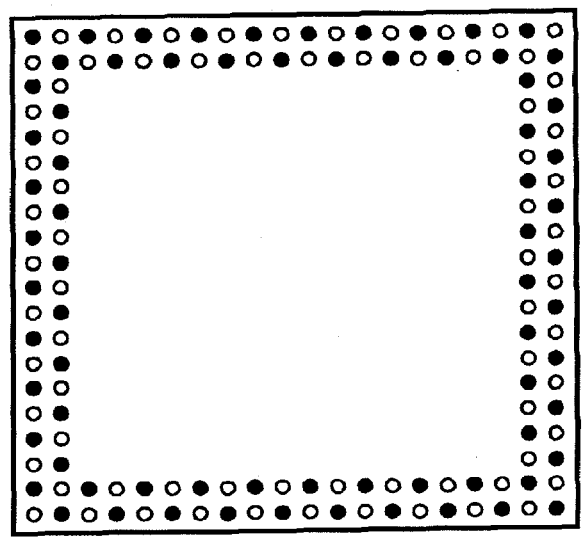
FIGS. 8A-8B are schematic drawings of the disposition of TSVs of the stacked LSIs to which the present invention is applied.
Figure 8B:
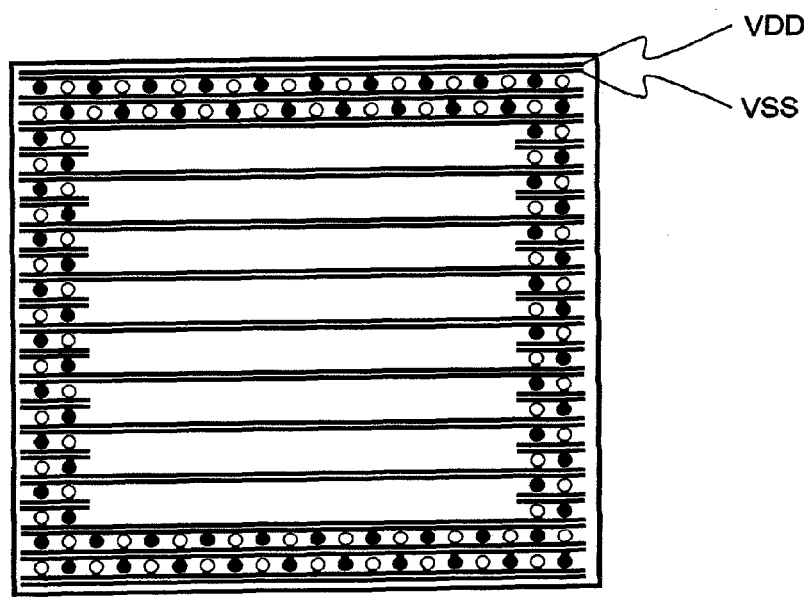

FIG. 8A shows an allocation drawing of power-supply TSVs of LSI using the present invention. In the power supplies of LSI, VSS which is a ground-potential power supply and VDD which is a high-potential power supply are present. By alternately disposing the TSVs for each of VSS and VDD, the capacity between the power supplies can be increased, and stability of the power supplies can be improved. Also, FIG. 8B shows the connection relation between the power-supply TSVs and power-supply wiring of the uppermost layer. In this drawing, two lines of power-supply wiring, that is, VSS and VDD are laid out between the power-supply TSVs. In this drawing, since the TSVs are largely shown in order to clarify the disposition of the TSVs and power-supply lines, the wirings and the TSVs appear as if they are disposed at high density. However, in practice, the density of the TSVs is low, and the wiring can be easily laid out. For example, TSVs having a diameter of 10 μm can be disposed at a pitch of 50 μm, and in this case, a space of 40 μm can be provided between the TSVs and a plurality of power-supply wirings can be easily disposed between the TSVs. At the connecting part of the power-supply line and the power-supply TSV, the power-supply line is made thick to have a convex shape. By this means, the power-supply line and the power-supply TSV can be reliably connected.

As described above, when the present invention is used, power can be supplied to the three-dimensionally stacked LSI chips. Also, by disposing the power-supply TSVs in a plurality of rows, a large current can be supplied to the stacked LSIs in which a plurality of chips are stacked and a large current is consumed.

Embodiment 1-2

Figure 9:
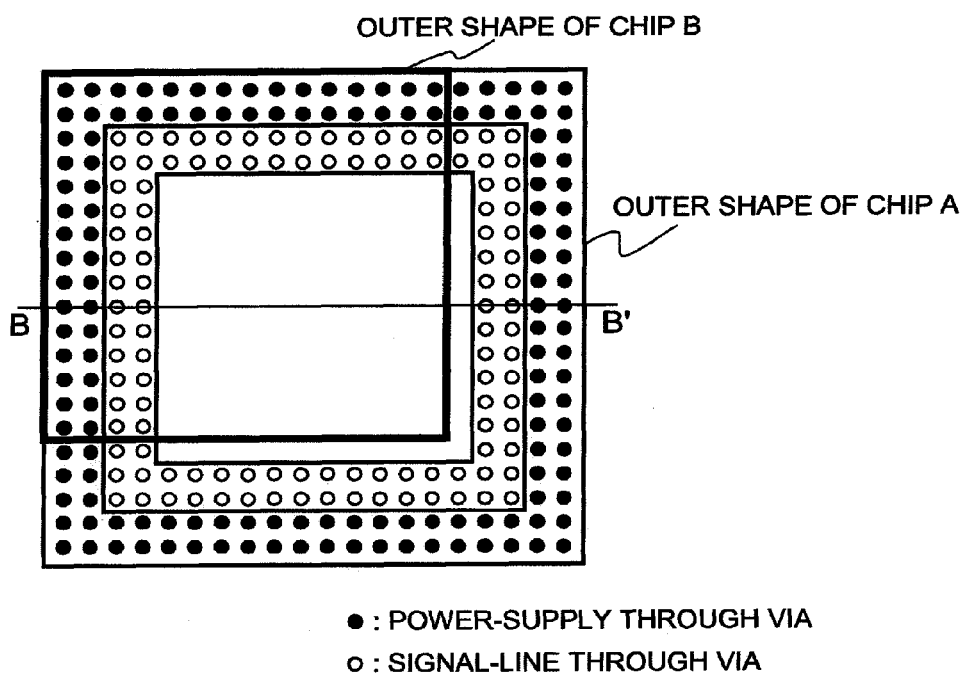
FIG. 9 is a schematic drawing of the disposition of TSVs of the stacked LSIs to which the present invention is applied.
Figure 10:
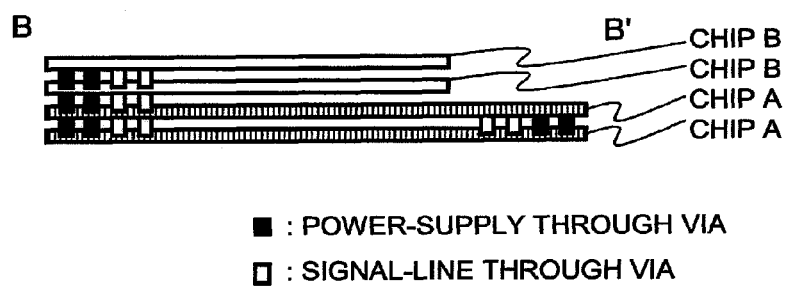
FIG. 10 is a cross-sectional view of the stacked LSIs to which the present invention is applied.

FIG. 9 shows a schematic drawing of the disposition of TSVs in the case where chips having different sizes are three-dimensionally stacked by using the present invention. The chip A is, for example, a CPU chip on which a plurality of CPUs are mounted, and the chip B is, for example, a memory chip on which a memory is mounted. Since the memory chip or the like consumes comparatively low power, the number of power-supply TSVs may be small. Therefore, more power-supply TSVs are provided on the chip A than on the chip B. Also, the number of signal-line TSVs required for communication with another chip is different in the chip A and in the chip B. FIG. 10 is a cross section of the chips of FIG. 9 taken along the line B-B'. On the left and upper halves of the chips, power-supply TSVs and signal-line TSVs that connect the respective chips are disposed at the same locations in the vertical direction. Furthermore, on the right and lower halves, the TSVs for the connection of the chips B are not present. In this manner, since the power-supply TSVs are disposed in the outermost periphery and the signal TSVs are disposed on the inner side thereof, the chips having different sizes can be stacked by disposing the chips so as to align the positions of the two sides of the chips and align the positions of the power-supply and signal-line TSVs. Furthermore, by disposing the chips so as to align the positions of the one sides of the chips based on the same idea, a chip having a smaller scale can also be stacked.

As described above, when the present invention is used, power can be supplied to the three-dimensionally stacked LSI chips, and furthermore, LSI chips of different types can be stacked. Moreover, since the power-supply TSVs are disposed in the chip outer peripheral part, the TSVs which supply power can be easily disposed even when LSIs having different sizes are stacked.

Embodiment 1-3

Figure 11:
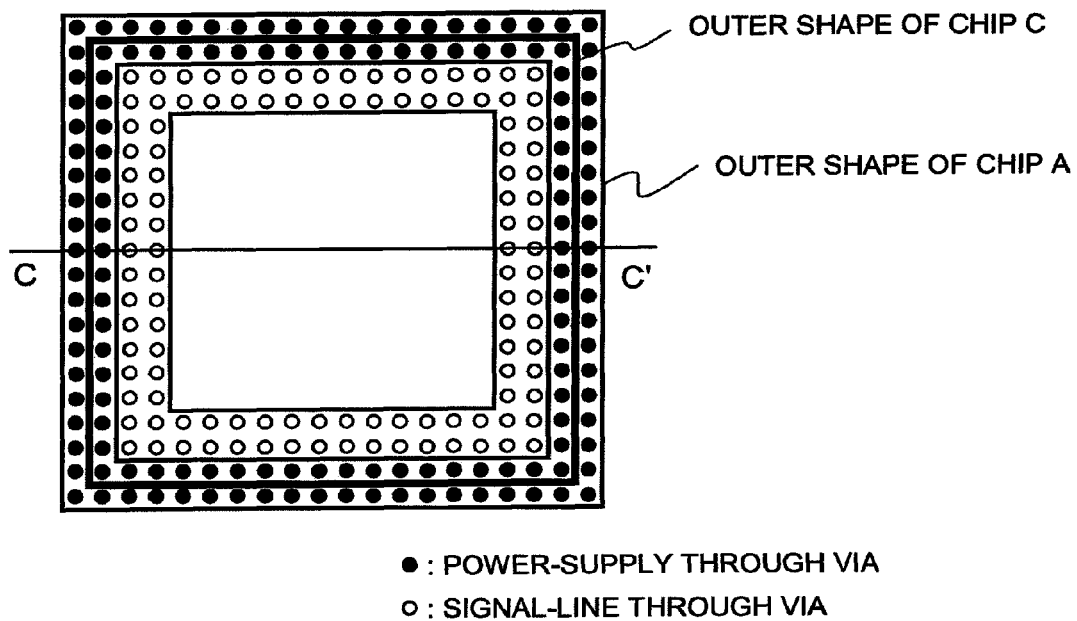
FIG. 11 is a schematic drawing of the disposition of TSVs of the stacked LSIs to which the present invention is applied.

FIG. 11 shows a schematic drawing of the disposition of TSVs in the case where chips having different sizes are three-dimensionally stacked by using the present invention. The chip A is, for example, a CPU chip on which a plurality of CPUs are mounted, and the chip C is, for example, a memory chip on which a memory is mounted. Since the memory chip or the like consumes comparatively low power, the number of power-supply TSVs can be small, and more power-supply TSVs are provided on the chip A than on the chip C. Moreover, unlike the Embodiment 1-2, the number of signal-TSVs can be made equal in the present embodiment. In this case, since the power-supply TSVs are disposed in a plurality of rows in the outermost periphery, the positions of signal TSVs can be aligned by not connecting some of the power-supply TSVs of the large chip to the small chip. Therefore, in this case, the positions of the signal-line TSVs have to be aligned between the chips A and the chips C.

Figure 12:
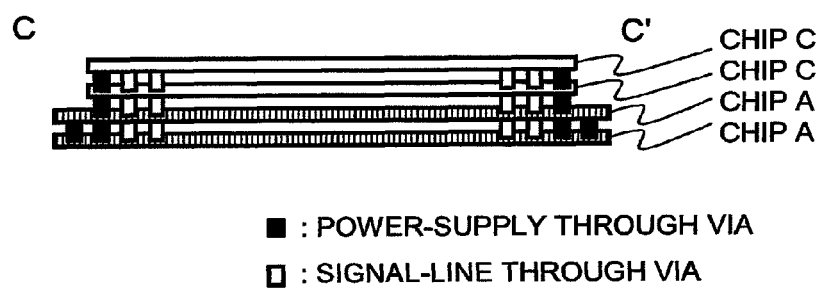
FIG. 12 is a cross-sectional view of the stacked LSIs to which the present invention is applied.

FIG. 12 is a cross section of the chips of FIG. 11 taken along the line C-C'. The signal-line TSVs that connect the respective chips are disposed at the same locations in the vertical direction. On the other hand, the power-supply TSVs are present on the chips A, to which large power has to be supplied, but are not present in some part on the chips C. By aligning the positions of the signal-line TSVs in this manner, the chips having different sizes and having the equal number of signal lines can be stacked.

As described above, when the present invention is used, power can be supplied to the three-dimensionally stacked LSI chips, and furthermore, the LSI chips of different types can be stacked. Moreover, since the power-supply TSVs are disposed in the chip outer peripheral part, the TSVs which supply power can be easily disposed, and the same number of TSVs for communication can be disposed on each of different chips even when LSIs having different sizes are stacked.

Embodiment 1-4

Figure 13:
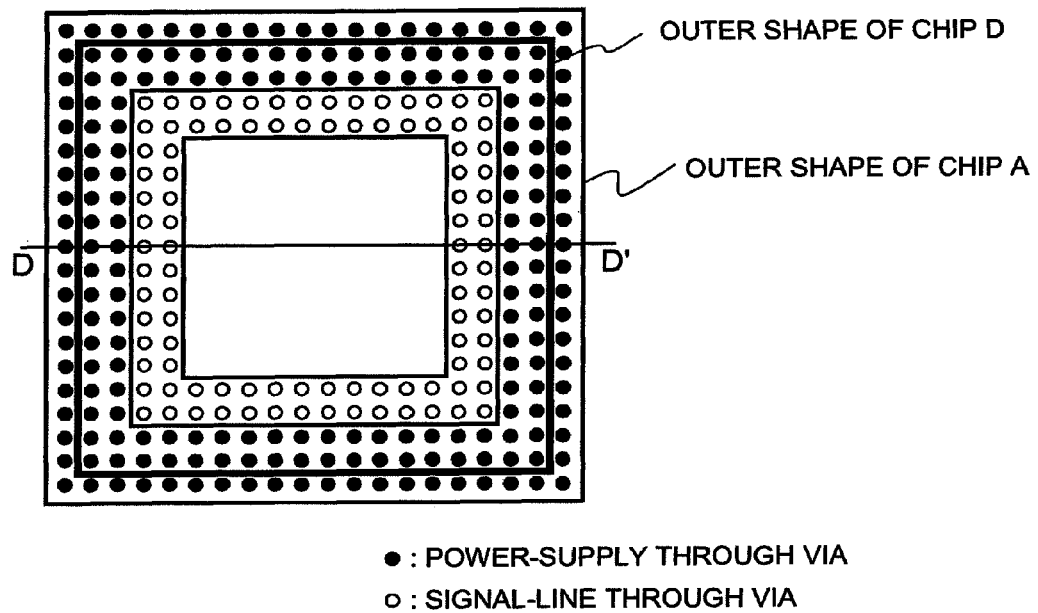
FIG. 13 is a schematic drawing of the disposition of TSVs of the stacked LSIs to which the present invention is applied.

FIG. 13 shows a schematic drawing of the disposition of TSVs in the case where chips having different sizes are three-dimensionally stacked by using the present invention. The chip A is, for example, a CPU chip on which a plurality of CPUs are mounted, and the chip D is, for example, a memory chip on which a memory is mounted. If the chips A and the chips D in which power-supply TSVs and signal-line TSVs are similarly disposed in outer peripheral parts have to be stacked, an interface chip has to be inserted in order to connect power-supply wirings and signal wirings between the chips A and the chips D.

Figure 14:
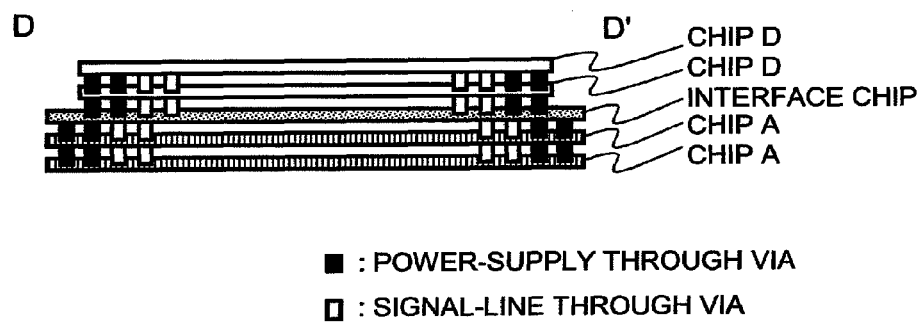
FIG. 14 is a cross-sectional view of the stacked LSIs to which the present invention is applied.

FIG. 14 is a cross section of the chips of FIG. 13 including the interface chip taken along the line D-D'. In the chip A and the chip D, the power-supply and signal-line TSVs are not disposed at the same positions in the vertical direction. Therefore, the interface chip is inserted therebetween, and the power-supply wirings and signal lines of the chip A and the chip D above and below are connected at that part. As described above, in the case where the chips having different sizes and further having different TSVs of power-supply lines and signal lines are stacked, the power supply and signal lines thereof can be connected by stacking the chips with inserting the interface chip therebetween.

As described above, when the present invention is used, power can be supplied to the three-dimensionally stacked LSI chips, and furthermore, the LSI chips of different types can be stacked. Moreover, since the power-supply TSVs are disposed in the chip outer peripheral part, an approximately equal current can be supplied to all the chips even when the LSIs having different sizes are stacked.

Embodiment 1-5

Figure 15A:
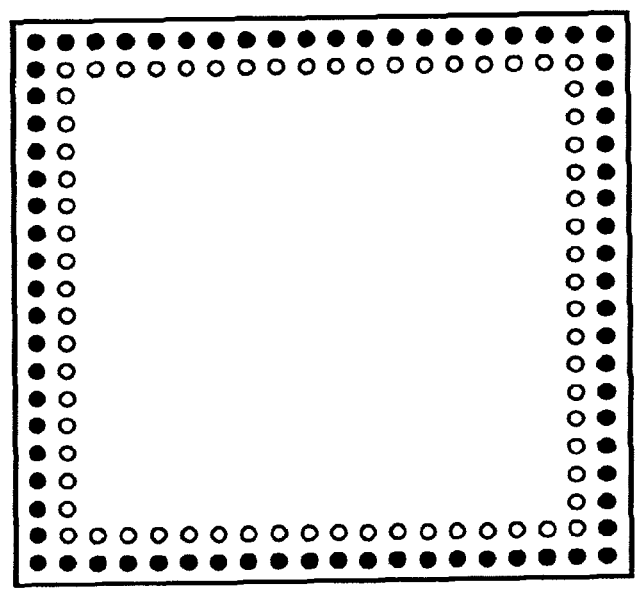
FIGS. 15A-15B are schematic drawings of the disposition of TSVs of the stacked LSIs to which the present invention is applied.
Figure 15B:
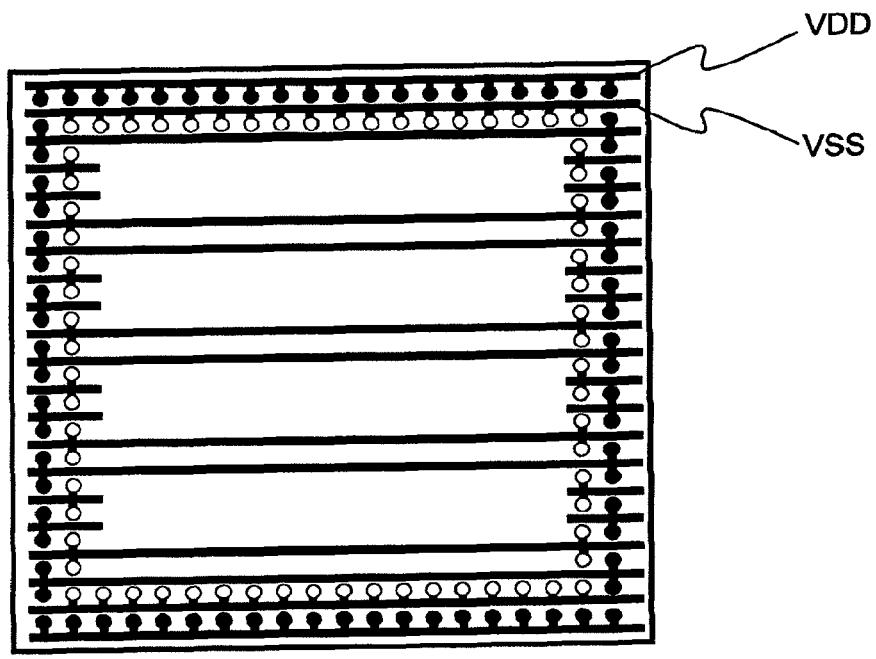

FIG. 15A shows an allocation drawing of power-supply TSVs of LSI using the present invention. This is equal to the Embodiment 1-1 except that VDD is allocated to the TSVs of the chip outermost periphery and VSS is allocated to the TSVs on the inner side thereof. When the power supplies having the same role are disposed adjacent to each other in this manner, it becomes easy to fabricate a pattern that connects the power-supply wirings and the TSVs. More specifically, as shown in FIG. 15B, it is only necessary to dispose either one of the power-supply wiring of VDD and that of VSS between the power-supply TSVs, and the number of power-supply lines can be reduced compared with FIG. 8. Therefore, each of the power-supply lines can be widened, and the resistance value thereof can be reduced.

As described above, when the present invention is used, power can be supplied to the three-dimensionally stacked LSI chips, and furthermore, the LSI chips of different types can be stacked. Moreover, by fixing the allocation of the TSVs to VDD and VSS from the outer peripheral part, one power-supply line can be laid out with respect to one TSV row, and each of the power-supply lines can have a large width.

Embodiment 1-6

Figure 16A:
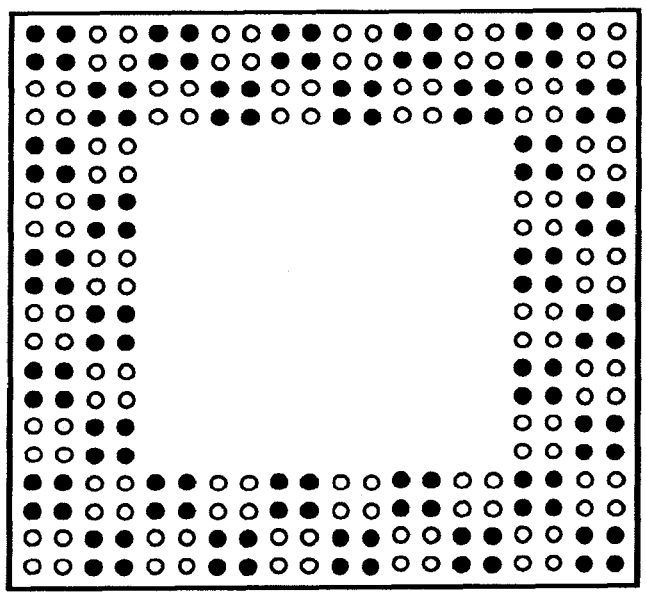
FIGS. 16A-16B are schematic drawings of the disposition of TSVs of the stacked LSIs to which the present invention is applied.
Figure 16B:
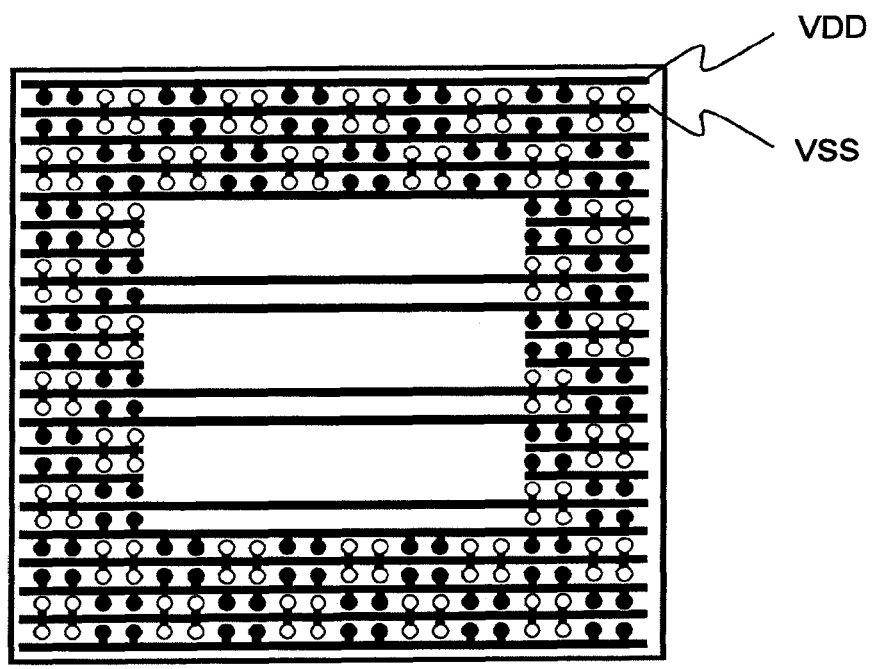

FIG. 16A shows an allocation drawing of power-supply TSVs of LSI using the present invention. This example shows the case in which the TSVs for power-supply lines are allocated in four rows in the chip outer periphery. In this chip, the power supply of the same type, that is, VDD or VSS is allocated to adjacent four TSVs, and they are disposed in a grid pattern. The configuration other than that is similar to that of the Embodiment 1-1. When this configuration is employed, the numbers of power-supply TSVs for VDD and VSS can be made equal to each other, and even when one TSV is in an inoperable state due to some reason such as breakage in the manufacture, since power-supply TSVs of the same type are disposed around it, concentration of current does not occur. In other words, when this configuration is employed, power-supply TSV disposition that is strong against breakage in the manufacture can be achieved. Furthermore, in the present embodiment, like the Embodiment 1-5, it is only necessary to lay out either one of the power-supply line of VDD or that of VSS between the power-supply TSVs (FIG. 16B), and each power-supply line can be widened.

As described above, when the present invention is used, power can be supplied to the three-dimensionally stacked LSI chips, and furthermore, the LSI chips of different types can be stacked. Moreover, since a plurality of TSVs of VDD and those of VSS are collectively allocated, the power-supply TSVs strong against, for example, breakage in the manufacture can be formed, one power-supply line can be laid out with respect to one TSV row, and each of the power-supply lines can have a large width.

Embodiment 1-7

Figure 17:
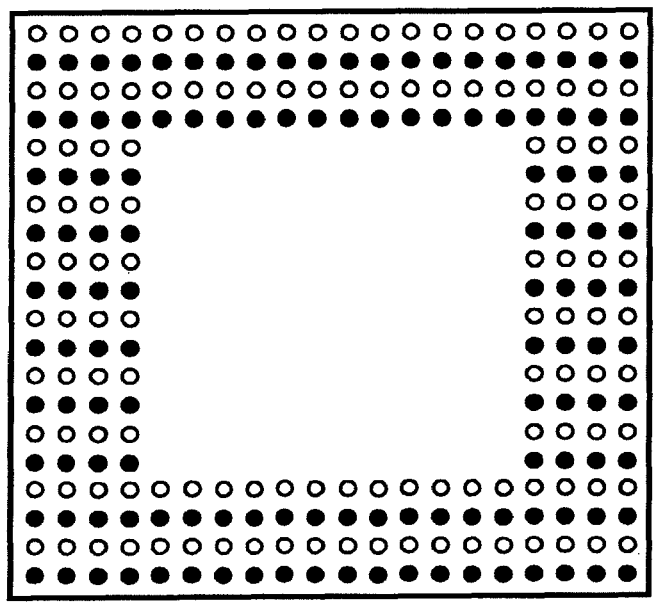
FIG. 17 is a schematic drawing of the disposition of TSVs of the stacked LSIs to which the present invention is applied.
Figure 18:
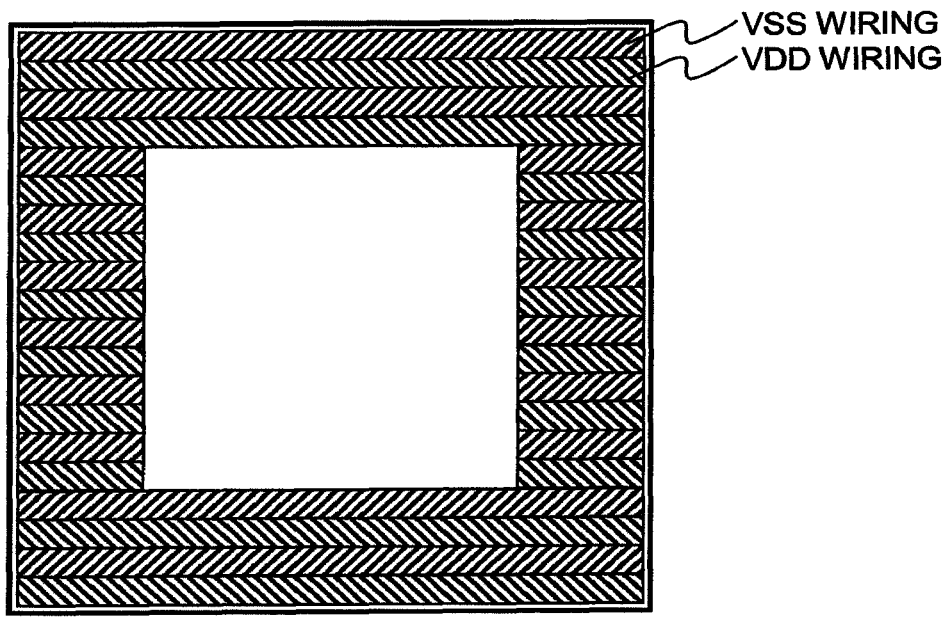
FIG. 18 is a schematic drawing of power supply wirings of the stacked LSIs to which the present invention is applied.

FIG. 17 shows an allocation drawing of power-supply TSVs of LSI using the present invention. This example shows the case in which the TSVs for power-supply lines are allocated to four rows in the chip outer periphery. In this chip, the power supply of the same type, that is, VDD or VSS is allocated to the TSVs in the same row arranged in the transverse direction. The configuration other than that is similar to that of the Embodiment 1-1. When this configuration is employed, the numbers of power-supply TSVs for VDD and VSS can be made equal to each other, and power-supply wiring layers to which the TSVs are connected can be arranged in the transverse direction of the chip along the TSVs. FIG. 18 shows the configuration of the power-supply wiring layer connected to the TSVs. As shown in the drawing, since the power supplies of the same types, that is, those for VDD and VSS are arranged in the same rows, metal wirings for power supply can be easily disposed like stripes. Particularly, the power-supply lines are laid out between the power-supply TSVs in the previous embodiments, but in the present embodiment, since the power supplies of the same type are arranged in the transverse direction, the power supply lines can be laid out on the power-supply TSVs instead of between the power-supply TSVs, and the power-supply lines can be further widened. In other words, in the above-described embodiments, part of the power-supply lines has to be widened to have a convex shape in order to connect the power-supply wiring and the power-supply TSVs, but in the present embodiment, the wiring (wider than the power-supply TSVs) that includes all of the power-supply TSVs can be formed, and it is not necessary to form the convex shape. Also, this wiring layer is a wiring layer of an upper layer of the chip connected to the upper surfaces of the TSVs and shows the state of the wiring layer of a lower layer of the chip to which the TSVs penetrating through silicon are connected. In practice, since the wiring layer of the lower layer of the chip has the shape through which the TSVs penetrate, in the other embodiments, the connection to the power-supply TSVs can be achieved also in the lower layer by providing the above-described convex shape. However, since the positions of the convex shapes and the TSVs have to be aligned, it is necessary to take into account the misalignment or the like. On the other hand, in the present embodiment, since the power-supply lines are made wider than the TSVs, the convex shapes are not required, contact may be carried out at any part of the wiring, and the connection between the power-supply lines and the power-supply TSVs in the wiring layer of the lower layer is facilitated.

As described above, when the present invention is used, power can be supplied to the three-dimensionally stacked LSI chips, and furthermore, the LSI chips of different types can be stacked. Moreover, the power-supply wiring that supplies power can be disposed on the TSVs by uniformizing the type of power supply supplied by the TSVs disposed in the transverse direction.

Embodiment 1-8

Figure 19A:
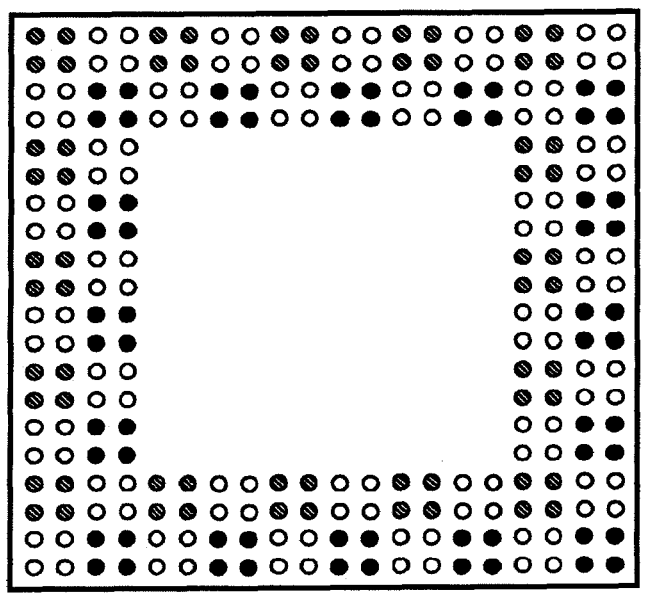
FIGS. 19A-19B are schematic drawings of the disposition of TSVs of the stacked LSIs to which the present invention is applied.

FIG. 19A shows an allocation drawing of power-supply TSVs of LSI using the present invention. This example shows the case in which the TSVs for power-supply lines are allocated to four rows in the chip outer periphery. This chip shown in FIG. 19A has the configuration having high power-supply voltage VDDH, low power-supply voltage VDDL, and ground-potential power supply VSS. In this chip, the power supply of the same type, that is, VDDH, VDL, or VSS is allocated to four adjacent TSVs, and they are disposed in a grid pattern. Regarding the number of the TSVs, the number obtained by adding the number of the TSVs for VDDH and the number of the TSVs for VDDL is equal to that for VSS. The reason therefor is that the number of the TSVs is determined depending on the current capacity because the current supplied from VDDH and VDDL has to flow via VSS. When this configuration is employed, the number of the power-supply TSVs can be determined by the number obtained by adding VDDH and VDDL and the number of VSS, and even when one TSV is in an inoperable state due to some reason such as breakage in the manufacture, since power-supply TSVs of the same type are disposed around it, concentration of current does not occur. In other words, when this configuration is employed, power-supply TSV disposition that is strong against breakage or the like in the manufacture can be achieved. Moreover, although the example in which the number of the types of power supply is three is shown in the present embodiment, the case where power supplies of four or more types are provided can also be supported in the same idea. Furthermore, although the example in which four TSVs are collectively arranged in a grid pattern is shown in the present embodiment, the configuration in which six TSVs of 2×3 or nine TSVs of 3×3 are collectively arranged in a grid pattern is also possible.

Figure 19B:
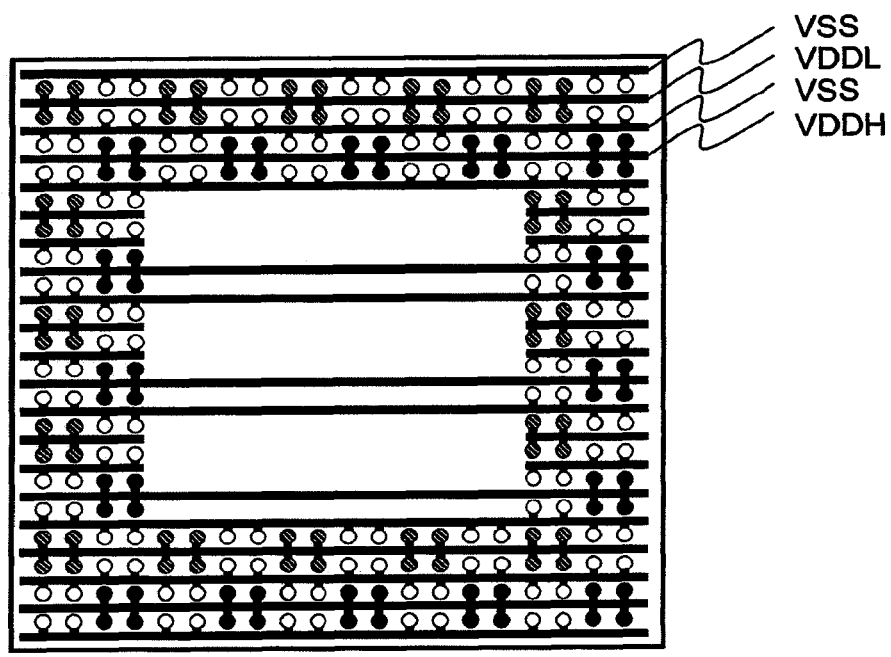

Furthermore, the TSVs for VDDH or VDDL are disposed in the same column (row) with respect to the transverse direction or the longitudinal direction. Therefore, as shown in FIG. 19B, it is only necessary to dispose any one of the power-supply lines of VDDH, VDDL, and VSS between the power-supply TSVs, and thus the power-supply lines can be widened.

As described above, when the present invention is used, power can be supplied to the three-dimensionally stacked LSI chips, and furthermore, the LSI chips of different types can be stacked. Also, since the power supplies of each of the three types are collectively disposed, it becomes possible to dispose one power-supply line with respect to one TSV row, and each of the power-supply lines can have a large width.

Embodiment 1-9

Figure 20A:
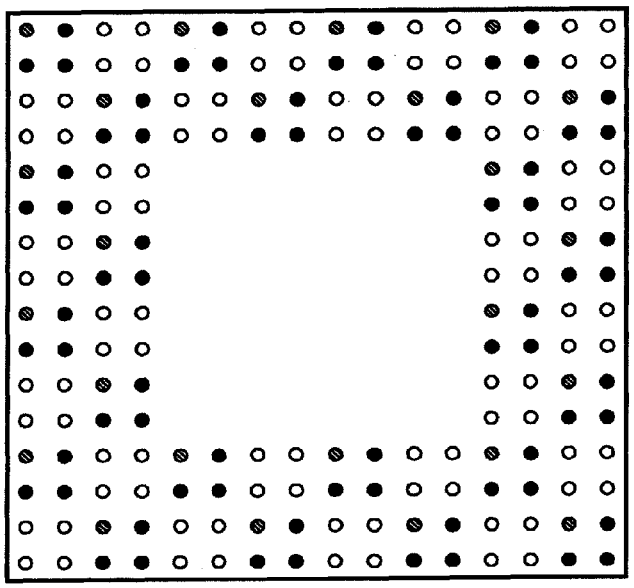
FIGS. 20A-20B are schematic drawings of the disposition of TSVs of the stacked LSIs to which the present invention is applied.
Figure 20B:
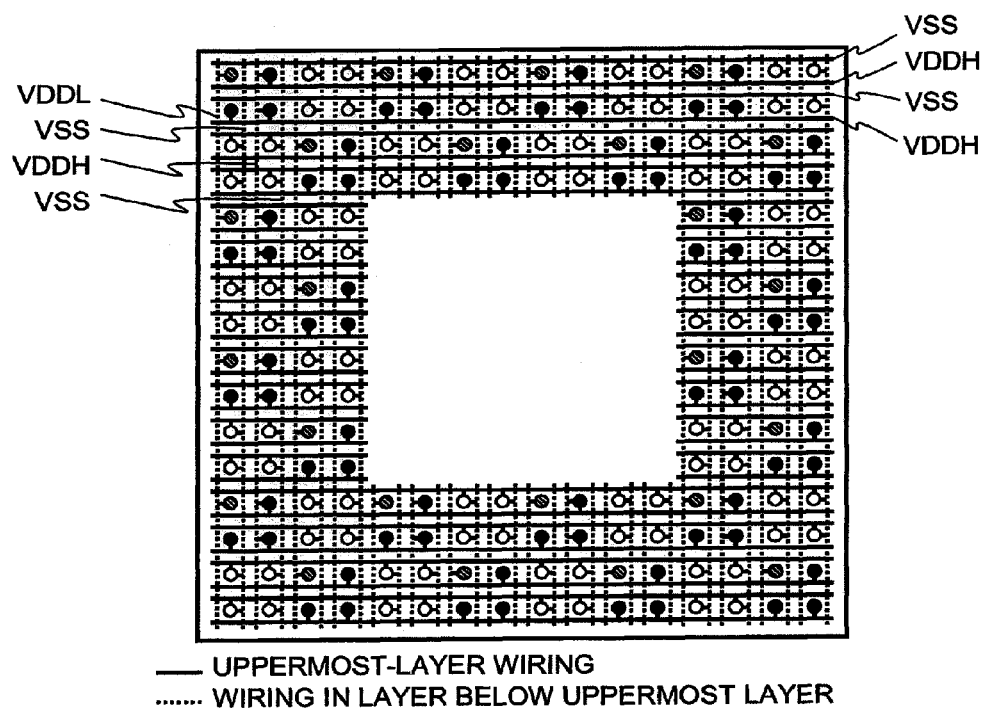

FIG. 20A shows an allocation drawing of power-supply TSVs of LSI using the present invention. This example shows the case in which the TSVs for power-supply lines are allocated to four rows in the chip outer periphery. This chip shown in FIG. 20A has the configuration having high power-supply voltage VDDH, low power-supply voltage VDDL, and ground-potential power-supply VSS. In this chip, the power supply of the VDD side or that of the VSS side is allocated to the four adjacent TSVs, and they are disposed in a grid pattern. Regarding the number of the TSVs, the number obtained by adding the number of the TSVs for VDDH and the number of the TSVs for VDDL is equal to that for VSS. The reason therefor is that the number of the TSVs is determined depending on the current capacity because the current supplied from VDDH and VDDL has to flow via VSS. Furthermore, since it is probably necessary to supply a larger current to VDDH because VDDH supplies a higher potential than VDDL, more TSVs are allocated to VDDH than to VDDL in order to equalize the current capacity. Moreover, as shown in FIG. 20B, power-supply wirings of the uppermost layer adjacent to the TSVs are allocated to VDDH and VSS, and they are connected by the wirings from the respective TSVs. The power-supply wirings which are adjacent to the TSVs in the layer just below the uppermost layer are allocated to VDDH, VDDL, and VSS, and they are connected by the wirings from the respective TSVs. When this structure is employed, connections to each of the power-supply wirings can be established from all the power-supply TSVs of three or more types. In this drawing, only the power-supply wirings adjacent to TSVs are shown, but in practice, additional wiring layers are disposed because sufficient space is present between the TSVs. For example, although only the wiring layer of VDDH and VSS is shown in the uppermost layer, the resistance of the power-supply wirings can be reduced by disposing wirings of VDDL or excessive wirings of VDDH and VSS therebetween. Moreover, although the example in which the number of the types of power supply is three is shown in the present embodiment, the case where power supplies of four or more types are provided can also be supported in the same idea. Furthermore, although the example in which four TSVs are collectively arranged in a grid pattern is shown in the present embodiment, the configuration in which six TSVs of 2×3 or nine TSVs of 3×3 are collectively arranged in a grid pattern is also possible. In that case, it is possible to set the ratio of VDDH and VDDL more finely.

As described above, when the present invention is used, power can be supplied to the three-dimensionally stacked LSI chips, and further, the LSI chips of different types can be stacked.

Embodiment 1-10

Figure 21:
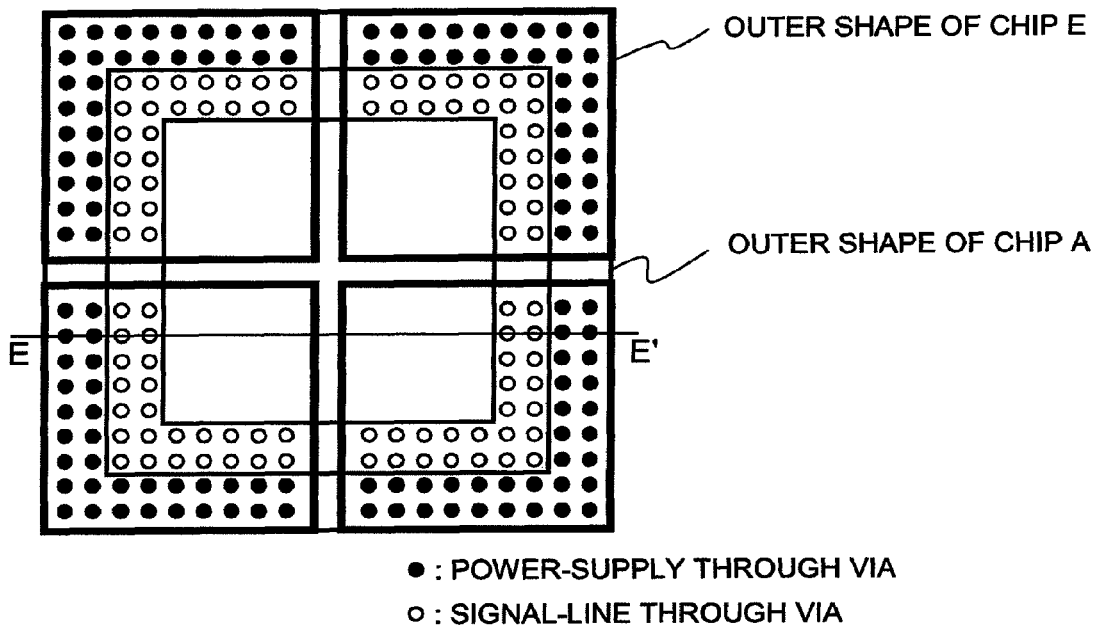
FIG. 21 is a schematic drawing of the disposition of TSVs of the stacked LSIs to which the present invention is applied.

FIG. 21 shows a schematic drawing of the disposition of TSVs in the case where chips having different sizes are three-dimensionally stacked by using the present invention. The chip A is, for example, a CPU chip on which a plurality of CPUs are mounted, and the chip E is, for example, a memory chip on which a memory is mounted. Basically, this example is based on the same idea as the Embodiment 1-2, but this example shows the case where the size of the chip E is about one quarter of the chip A. In this case, the chips having different areas can be stacked by disposing power-supply TSVs in the outer peripheral part of the chip A and disposing the TSVs of the chips E at the same positions thereabove.

Figure 22:
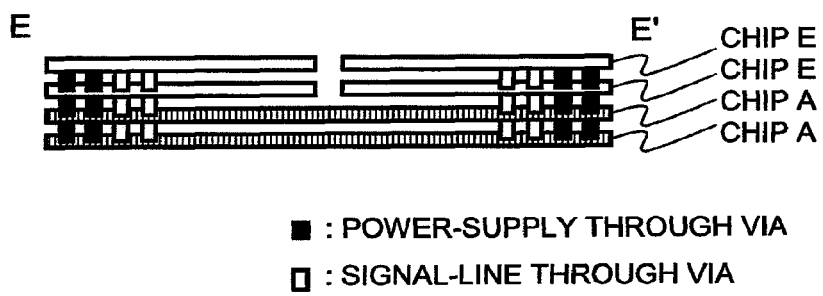
FIG. 22 is a cross-sectional view of the stacked LSIs to which the present invention is applied.

FIG. 22 is a cross section of the chips of FIG. 21 taken along the line E-E'. The power-supply and signal-line TSVs that connect the respective chips are disposed at the same locations in the vertical direction. When the positions of the signal-line TSVs are aligned in this manner, the chips having different sizes and the equal number of signal lines can be stacked.

As described above, when the present invention is used, power can be supplied to the three-dimensionally stacked LSI chips, and furthermore, the LSI chips of different types can be stacked.

Embodiment 1-11

Figure 23:
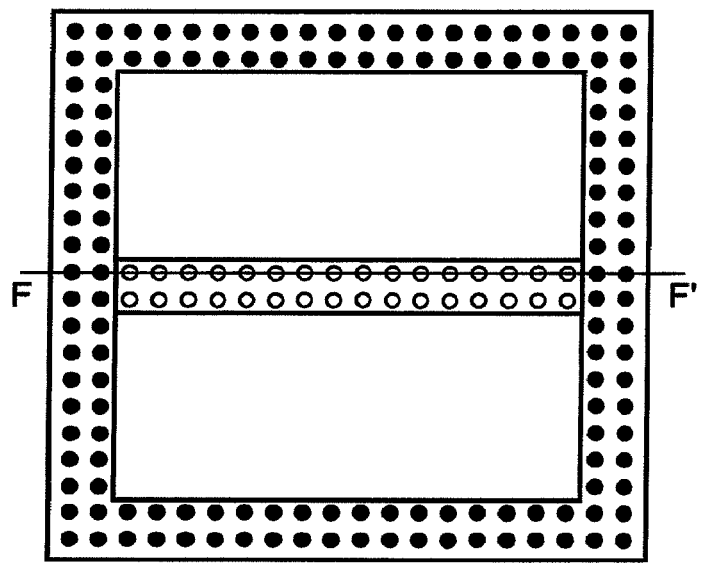
FIG. 23 is a schematic drawing of the disposition of TSVs of the stacked LSIs to which the present invention is applied.

FIG. 23 shows a schematic drawing of the disposition of TSVs in the case where several types of chips are stacked by using the present invention. In this configuration, the power-supply TSVs are disposed in the outer peripheral part of the chips like the Embodiment 1, and the signal-line TSVs are disposed in the center part of the chips unlike the Embodiment 1.

Figure 24:
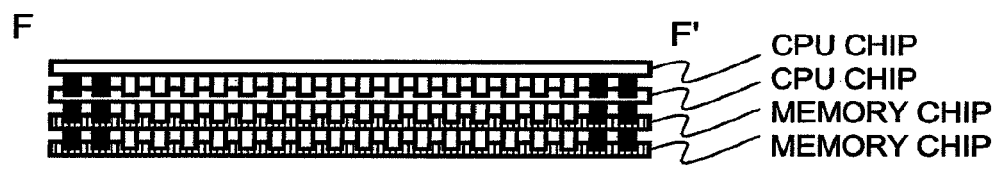
FIG. 24 is a cross-sectional view of the stacked LSIs to which the present invention is applied.

FIG. 24 is a cross section of the chips of FIG. 23 taken along the line F-F'. This example shows the configuration in which two CPU chips on which a plurality of CPUs are mounted and two memory chips on which memories are mounted are stacked. The power-supply and signal-line TSVs that connect the respective chips are disposed at the same locations in the vertical direction.

Figure 25:
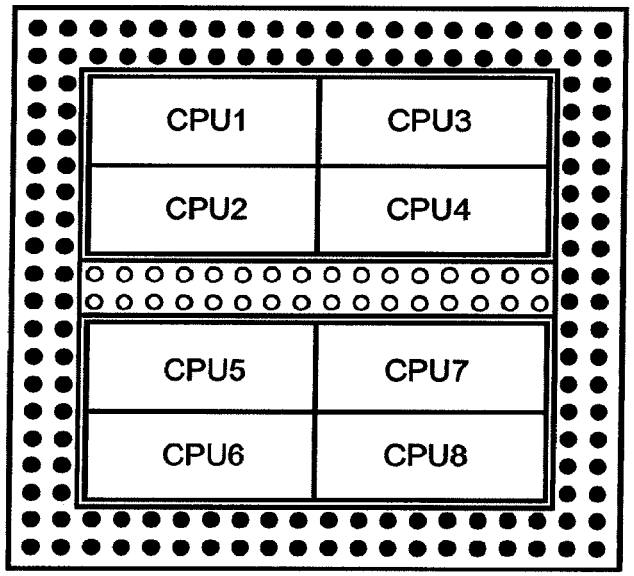
FIG. 25 is a schematic drawing of the disposition of TSVs and circuits of the stacked LSIs to which the present invention is applied.
Figure 26:
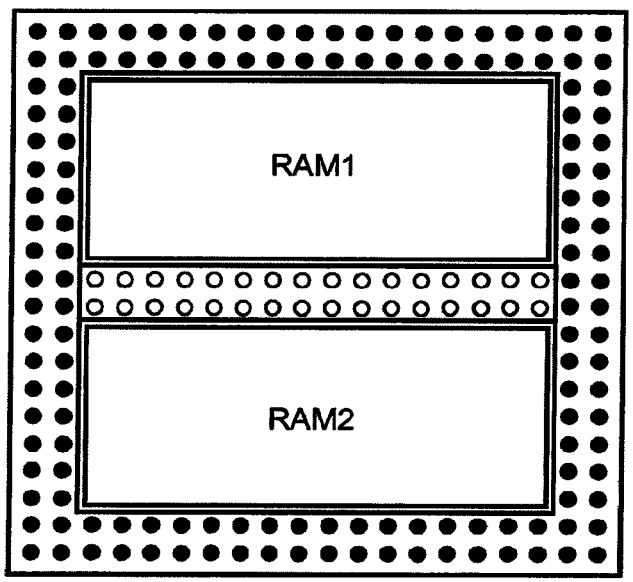
FIG. 26 is a schematic drawing of the disposition of TSVs and circuits of the stacked LSIs to which the present invention is applied.

Furthermore, FIG. 25 shows a configuration example of the disposition of CPU circuits in the CPU chip. Eight CPUs are mounted on this chip, and power-supply TSVs are disposed in the outer peripheral part. Furthermore, signal-line TSVs are disposed in the center part of the chip where the CPUs are not disposed. FIG. 26 shows a configuration example of the disposition of memories in the memory chip. Also in the memory chip, like the CPU chip, memory circuits are disposed in the center part of the chip, and the signal-line TSVs are disposed in the part where the memory circuits are not located. In this configuration, necessary current supplying capability is ensured by disposing the power-supply TSVs in the outer peripheral part of the chip, and the signal-line TSVs are disposed in the gap between the inner circuits so that the signal-line TSVs can be disposed by efficiently utilizing the spaces in the chip. Furthermore, since the signal-line TSVs can be disposed in the vicinity of the internal operating circuits, the performance in the case where communication is carried out via the signal lines is improved.

As described above, when the present invention is used, power can be supplied to the three-dimensionally stacked LSI chips, and furthermore, the LSI chips of different types can be stacked.

Embodiment 1-12

Figure 27:
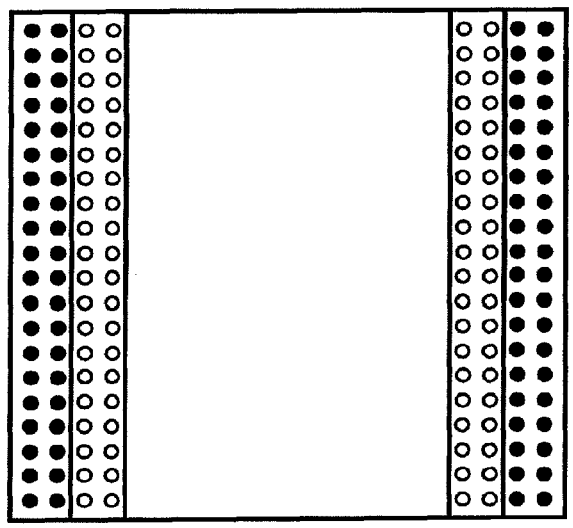
FIG. 27 is a schematic drawing of the disposition of TSVs of the stacked LSIs to which the present invention is applied.

FIG. 27 shows a schematic drawing of the disposition of TSVs in the case where several types of chips are stacked by using the present invention. In this configuration, unlike the Embodiment 1-1, power-supply TSVs are disposed in a plurality of rows in the left and right outer peripheral parts of the chips, and signal-line TSVs are disposed in a plurality of rows on the inner side thereof. All of the stacked chips have a similar TSV disposition configuration. In this configuration, unlike the Embodiment 1-1, the TSVs are not disposed in the upper and lower outer peripheral parts of the chips. If an internal circuit has a longitudinally long shape and the internal circuit has to be located up to the location near the outer peripheral part, the chip area can be reduced by employing the configuration of the present embodiment.

Figure 28:
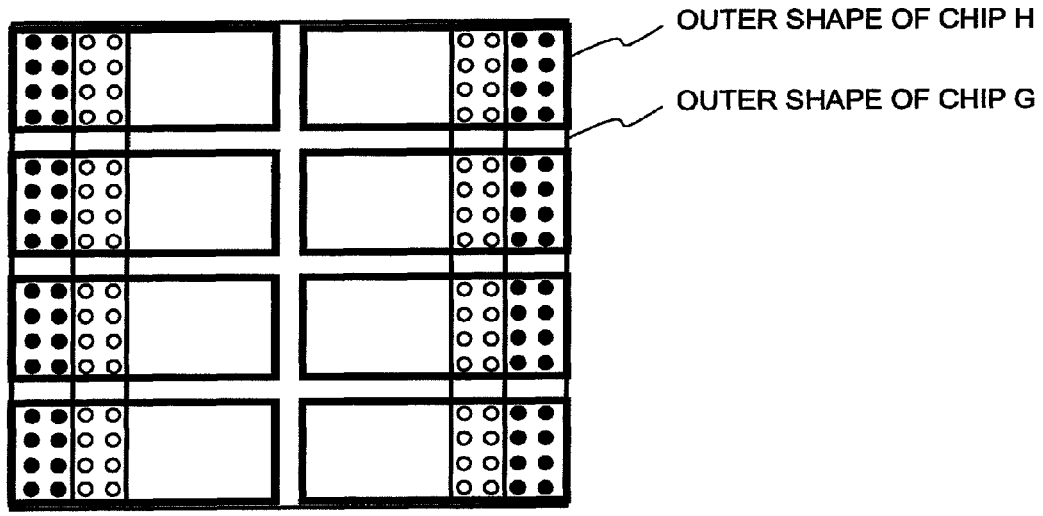
FIG. 28 is a schematic drawing of the disposition of TSVs of the stacked LSIs to which the present invention is applied.

FIG. 27 shows the case where the chips having approximately the same area are stacked, but the configuration of the present embodiment is sometimes advantageous in the case where a plurality of chips having small area are stacked. FIG. 28 shows a schematic drawing of the disposition example of TSVs in this case and the respective chips. In this example, the chip G represents a large-area chip, and the chip H represents a chip whose area is about one eighth of the area of the chip G. In the chip G, the TSVs are disposed in the left and right outer peripheral parts of the chip. The plurality of chips having small areas are stacked so that the TSVs thereof are located at the same positions as the TSVs of the chip G. In the configuration of the present embodiment, for example, when eight chips each having ⅛ area are stacked in this manner, disposition efficiency is improved compared with the configuration of the Embodiment 1-2.

As described above, when the present invention is used, power can be supplied to the three-dimensionally stacked LSI chips, and furthermore, the LSI chips of different types can be stacked.

Embodiment 1-13

Figure 29:
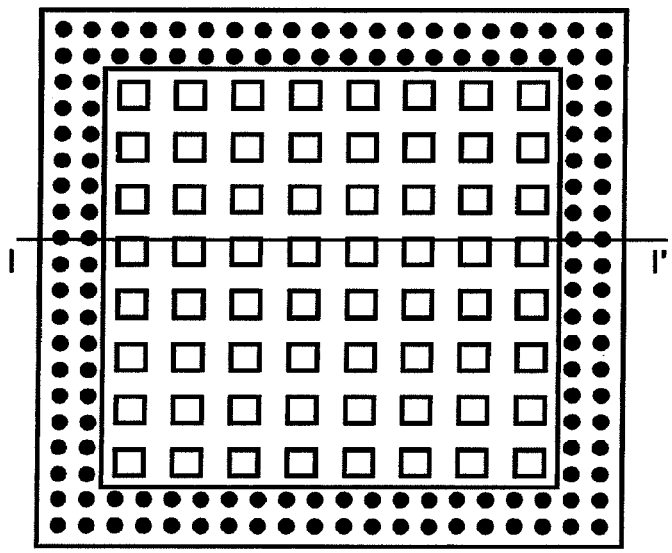
FIG. 29 is a schematic drawing of the disposition of TSVs of the stacked LSIs to which the present invention is applied.

FIG. 29 shows a schematic drawing of the disposition of TSVs and coils used in communication between chips in the case where several types of chips are stacked by using the present invention. Embodiments 1-1 to 1-12 show the examples in which the TSVs are used in the signal communication between the chips in the case where the chips are three-dimensionally stacked. The present embodiment shows the configuration example in the case where inductive coupling communication by the coils is used in the communication between the chips. In this configuration, a plurality of rows of power-supply TSVs are disposed in the outer peripheral part of the chips. Furthermore, operating circuits of the chips such as CPUs and memories are disposed in the center parts of the chips, and the coils for inter-chip communication are formed by using wirings of the upper layers thereof.

Figure 30:
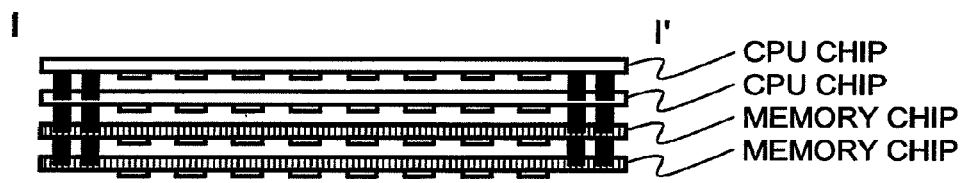
FIG. 30 is a cross-sectional view of the stacked LSIs to which the present invention is applied.

FIG. 30 is a cross section of the chips of FIG. 29 taken along the line I-I'. This example shows the configuration in which two CPU chips on which a plurality of CPUs are mounted and two memory chips on which memories are mounted are stacked. The power-supply TSVs that connect the respective chips are disposed at the same locations in the vertical direction, and the communication coils which carry out inter-chip communication are also disposed at the same locations in the vertical direction.

When the power-supply TSVs are disposed in the outer peripheral part of the chip in this manner, if the TSVs are not used in the inter-chip communication, the operating circuits and the circuits used in inter-chip communication can be disposed in the center parts of the chips, and the circuits for stacked chips can be disposed by efficiently utilizing the region in the chips. Furthermore, when the present invention is used, power can be supplied to the three-dimensionally stacked LSI chips, and furthermore, the LSI chips of different types can be stacked.

Embodiment 1-14

Figure 31:
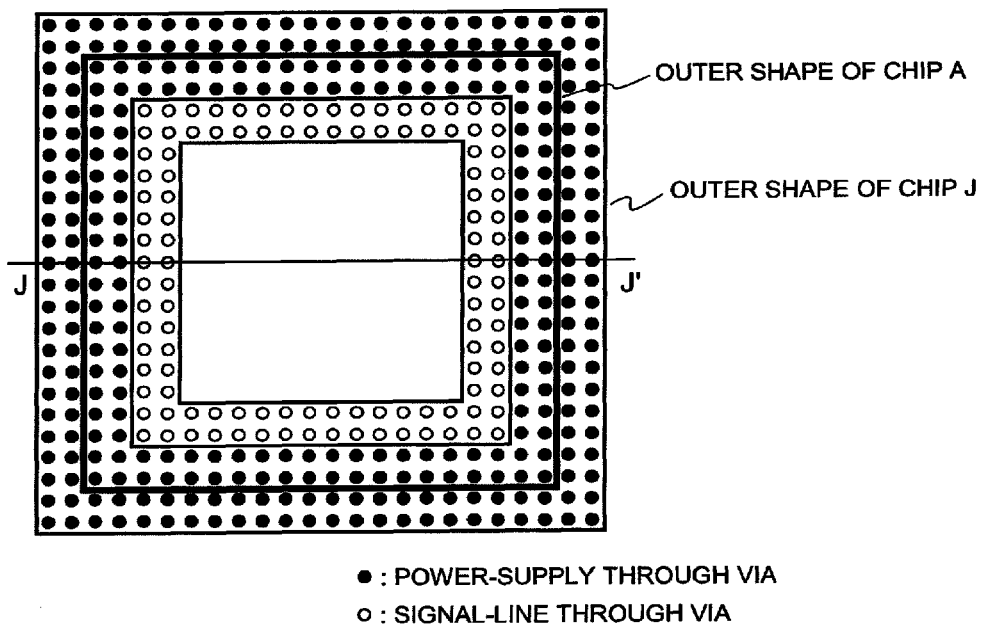
FIG. 31 is a schematic drawing of the disposition of TSVs of the stacked LSIs to which the present invention is applied.

FIG. 31 shows a schematic drawing of the disposition of TSVs in the case where chips having different sizes are three-dimensionally stacked by using the present invention. The chip J is, for example, a CPU chip on which a plurality of CPUs are mounted, and the chip A is, for example, a memory chip on which a memory is mounted. The number of power-supply TSVs can be reduced in a chip having comparatively low power consumption such as a memory chip, and reversely, a larger number of power-supply TSVs are required in a chip of large power such as a CPU chip. The number of the necessary signal-line TSVs is equal in the chip A and in the chip J.

Figure 32:
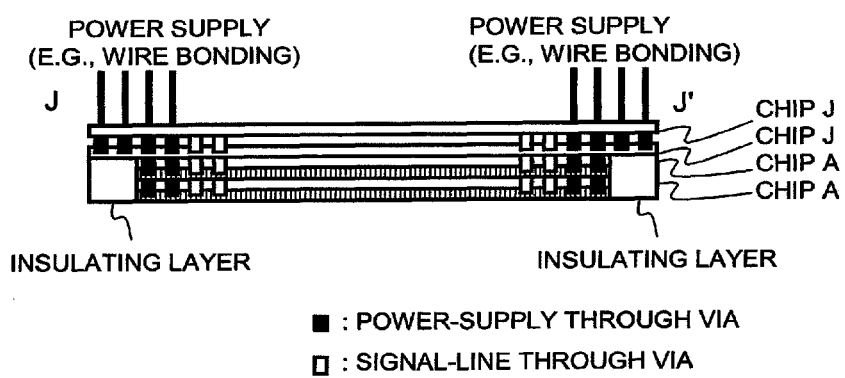
FIG. 32 is a cross-sectional view of the stacked LSIs to which the present invention is applied.

FIG. 32 is a cross-sectional view of the chips of FIG. 31 taken along the line J-J'. The signal-line TSVs that connect the respective chips are disposed at the same locations in the vertical direction. On the other hand, the power-supply TSVs are present in the chips J to which large power has to be supplied, but are not present in some parts in the chips A. When the positions of the signal-line TSVs are aligned in this manner, the chips having different sizes and the same number of signal lines can be stacked. Furthermore, in the present configuration, since the large chips J are disposed above the small chips A, the region below the chips J where the chips A are not present has to be filled with an insulating layer or the like. Moreover, in the present configuration, since the chips of large power are stacked on the upper side of the stacked chips, power has to be supplied from the side of the chips having large power consumption by wire bonding or the like.

As described above, when the present invention is used, power can be supplied to the three-dimensionally stacked LSI chips, and furthermore, the LSI chips of different types can be stacked.

Embodiment 2

Next, a method of testing whether a fault has occurred in power-supply TSVs or not will be described. The test method described below can be applied to the configuration other than that of the invention described in the Embodiment 1. However, in the case where many power-supply TSVs are disposed in the outer peripheral part like the invention described in the Embodiment 1, operation can be sufficiently carried out in some cases as the whole stacked LSIs even if one TSV has a fault, and the invention described below is particularly effective because such a situation can also be taken into consideration.

Embodiment 2-1

Figure 33:
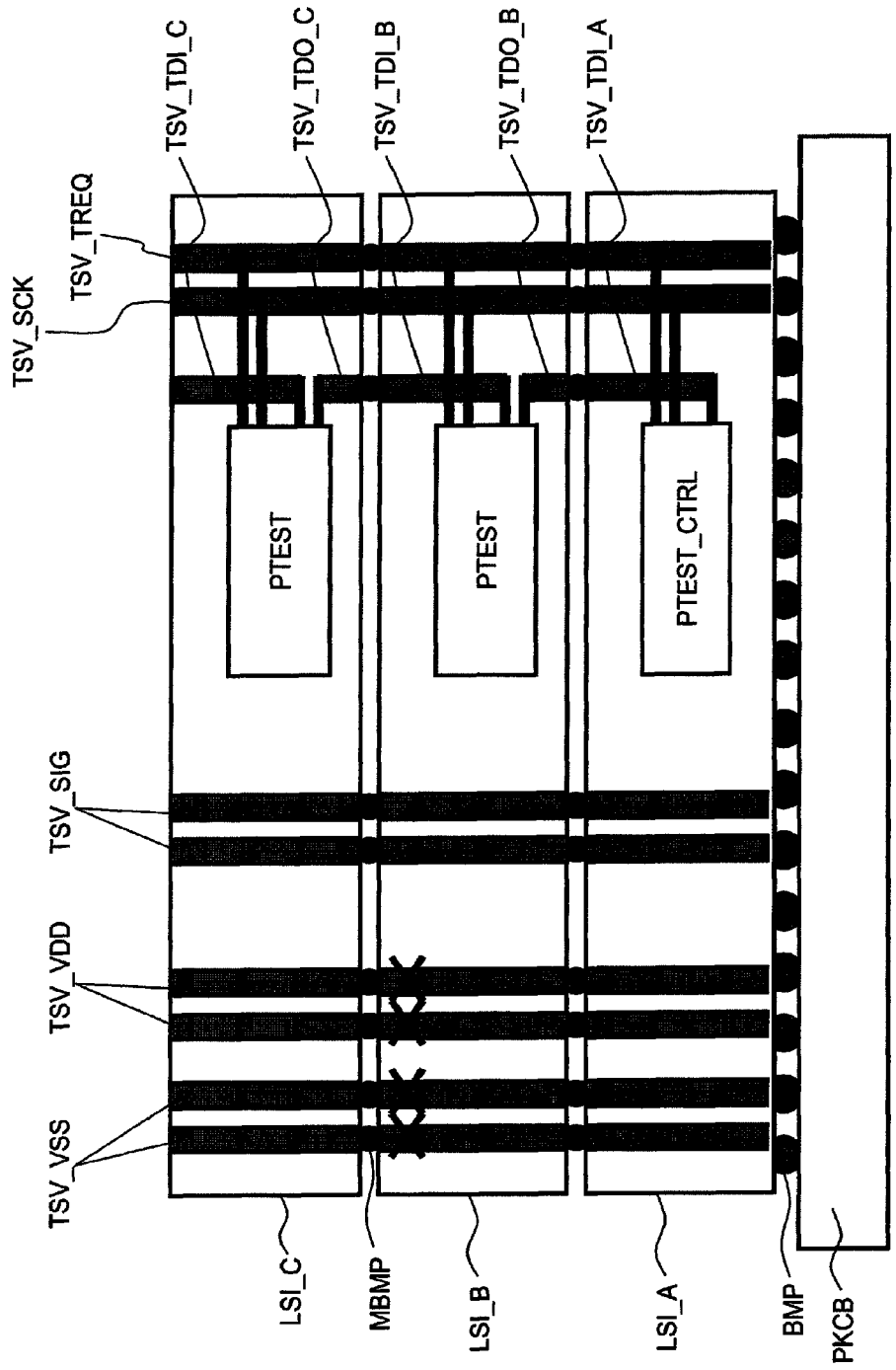
FIG. 33 is a conceptual drawing in a cross-sectional direction of the semiconductor device according to the present invention.

FIG. 33 shows a cross-sectional view of stacked layers of a semiconductor device according to the Embodiment 2 of the present invention and the state of occurrence of a fault.

In this embodiment, the configuration in which semiconductor integrated circuits LSI_A, LSI_B, and LSI_C are stacked in this order above a package substrate PKCB is shown. The three LSIs are stacked so that the circuit-mounted surface of each of them is directed downward (face down). LSI_A in the lowermost layer is electrically connected to the package substrate PKCB via solder bumps BMP, and LSI_B and LSI_C are electrically connected to the LSI of the layer therebelow via micro bumps MBMP and through silicon vias TSV.

TSV_VSS is a through silicon via for supplying the ground potential to the chips, and TSV_VDD is a through silicon via for supplying a power-supply potential to the chips. TSV_VSS and TSV_VDD are disposed at the same positions in each of the LSIs and electrically connect the upper and lower chips to each other via the micro bumps MBMP. In other words, LSI_B is supplied with power via LSI_A, and LSI_C is supplied with power via LSI_B. LSI_A is supplied with power from outside via the package substrate PKCB.

In this case, for example, when disconnection occurs at all the parts represented by X in TSV_VSS and TSV_VDD of FIG. 33, power is supplied to LSI_A and LSI_B, but power is not supplied to LSI_C, and thus LSI_C does not operate. Also, in the case where contact failure occurs at the parts represented by X in FIG. 33 and the resistance value thereof is increased, if a process that consumes large power is tried to be carried out in LSI_C, the process may not be correctly carried out due to insufficient power. A similar phenomenon may occur also in the case where disconnection occurs at some of the parts represented by X. The stacked LSIs according to the present embodiment provide a power-supply test method that detects a power-supply fault due to such disconnection or contact failure.

In FIG. 33, a power-supply test control circuit PTEST_CTRL is a functional block for controlling the power-supply test sequence of the stacked LSI package and is mounted on LSI_A of the lowermost layer. A power-supply test circuit PTEST is a functional block for executing a power-supply test of the single mounted LSI, and is mounted on LSI_B and LSI_C. PTEST executes the power-supply test of each LSI by a control signal from PTEST_CTRL.

TSV_SIG is a through silicon via for the signals for carrying out data communication between LSI_A, LSI_B, and LSI_C.

TSV_TREQ, TSV_SCK, TSV_TDI (TSV_TDI_A, TSV_TDI_B, TSV_TDI_C), and TSV_TDO (TSV_TDO_B, TSV_TDO_C) are through silicon vias for the signals used in power-supply tests. Each of TSV_TREQ and TSV_SCK is a through silicon via for transmitting the signal output from PTEST_CTRL to PTEST, TSV_TREQ is used for controlling the power-supply test carried out by PTEST, and TSV_SCK is a through silicon via which gives a clock signal for reading the result of the power-supply test to PTEST. Unlike the other silicon vias, the through silicon vias are electrically separated in LSI in TSV_TDI and TSV_TDO. More specifically, TSV_TDO_C is configured to be electrically connected to TSV_TDI_B, and TSV_TDO_B is configured to be electrically connected to TSV_TDI_A.

Figure 34:
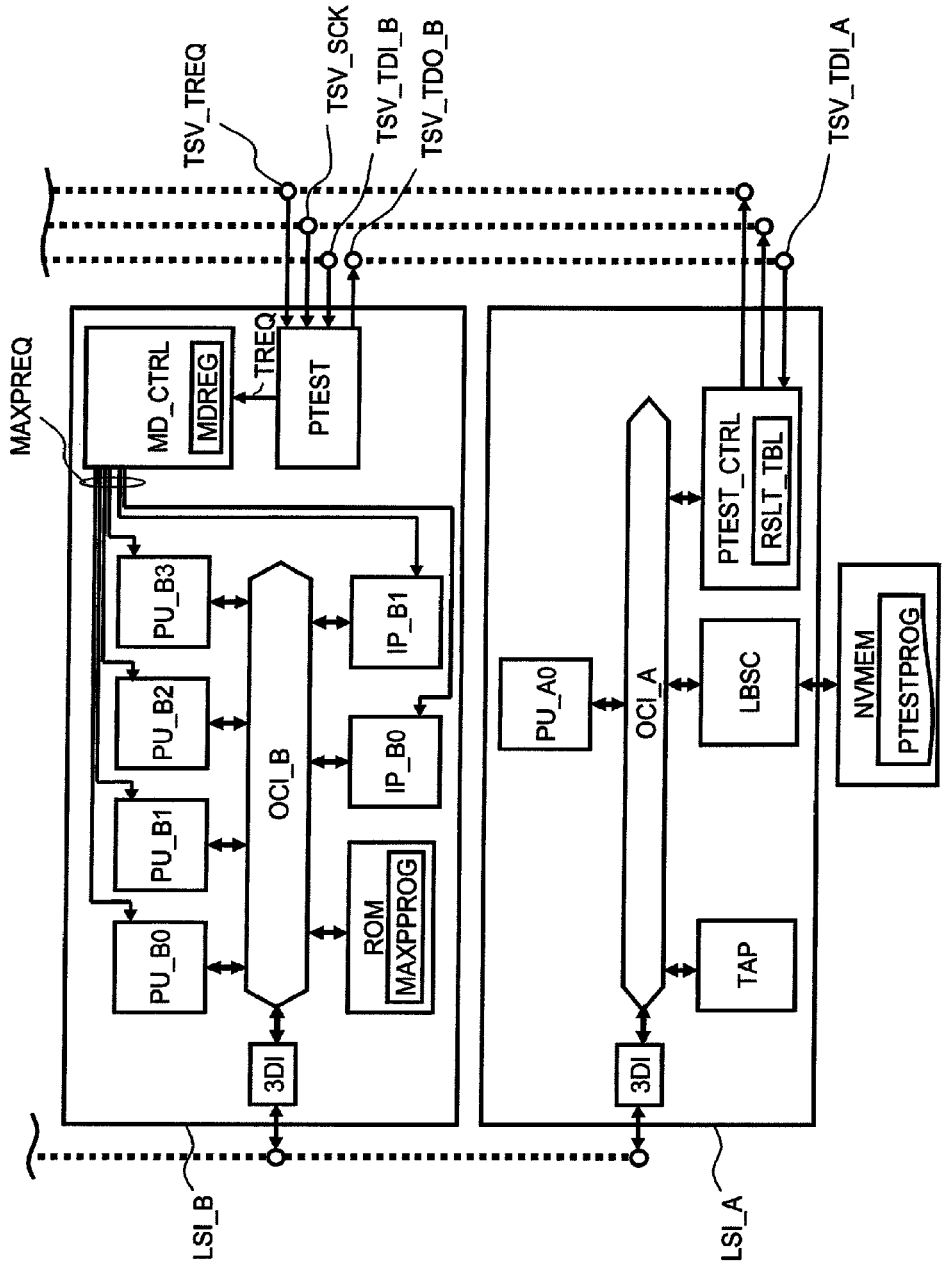
FIG. 34 is a circuit drawing showing the configuration of the main part of the semiconductor device according to the present invention.

FIG. 34 shows an embodiment of the logical configuration and connection of functional blocks mounted on LSI_A and LSI_B of FIG. 33. In FIG. 34, the logical configuration and connection of LSI_C are not shown, but are the same as those of LSI_B. TSV_SIG, TSV_TREQ, TSV_SCK, TSV_TDI, and TSV_TDO represent the same electrodes denoted by the same symbols in FIG. 33, and broken lines represent presence of electrical connections.

In FIG. 34, LSI_A is provided with a processing unit PU_A0 which is an execution processing unit of arithmetic instructions, 3DI which is a communication interface between the stacked LSIs, a test access port TAP which can be connected to an external debugger, an external tester or the like, a local bus controller LBSC for accessing an external device bus, PTEST_CTRL for controlling the power-supply test sequence of the stacked LSI package shown in FIG. 33, and an on-chip interconnect OCI_A which connects the functional blocks in LSI_A. PTEST_CTRL is provided with a test result table RSLT_TBL for storing power-supply test results. Also, LSI_A is connected to an external non-volatile memory NVMEM via LBSC. In the non-volatile memory NVMEM, for example, a power-supply test program PTESTPROG in which a power-supply test sequence is described is stored.

LSI_B is provided with four processing units (PU_B0, PU_B1, PU_B2, PU_B3) which are execution processing units of arithmetic instructions, functional modules IP_B0 and IP_B1 which carry out particular arithmetic processes and control processes, 3DI which is a communication interface between stacked LSIs, a read-only memory ROM which is composed of, for example, an array of fixed storage elements, an on-chip interconnect OCI_B which connects the functional blocks in LSI_B, an operation-mode controlling unit MD_CTRL, and PTEST for controlling the power-supply test of LSI_B shown in FIG. 33. MD_CTRL is provided with a register MDREG for setting an operation mode. In the read-only memory ROM, a maximum-power consuming program MAXPPROG is stored.

Other than executing normal processes, LSI_B is characterized by having a mechanism which activates all of the processing units and functional modules mounted on LSI_B for detecting faults of power-supply through silicon vias to simulate the operation to consume maximum power. Hereinafter, this mechanism will be referred to as a maximum-power consuming mechanism, and details thereof will be described. In this specification, "maximum power consumption" does not mean the consumption of the logically conceivable largest power by the processing units or functional modules, but refers to the state in which average power consumption in a predetermined period becomes larger than that in normal operation (in the operation in which normal programs are processed in a normal mode).

The start and end of the operation of the maximum-power consuming mechanism are controlled by PTEST. When PTEST asserts a test request signal TREQ, MD_CTRL writes 1 to a particular bit (power-consuming-mode transition bit) in the register MDREG therein. When PTEST negates the test request signal TREQ, MD_CTRL writes 0 to the power-consuming-mode transition bit in MDREG.

MD_CTRL switches assert/negate of a power-consuming-mode transition request signal MAXPREQ in accordance with the content of the power-consuming-mode transition bit in MDREG. When MD_CTRL asserts the power-consuming-mode transition request signal MAXPREQ, the processing units PU_B0 to PU_B3 and the functional modules IP_B0 and IP_B1 make the transition to a power consuming mode. On the other hand, when MD_CTRL negates MAXPREQ, they return to the state before the transition to the power consuming mode.

When the processing units PU_B0 to PU_B3 make the transition to the power consuming mode, the processing units load the maximum-power consuming program MAXPPROG from the read-only memory ROM via the on-chip interconnect OCI_B and execute the program. In the maximum-power consuming program, the process to activate all or most of the circuit blocks included by the processing units is defined. This can be realized by, for example, subjecting a particular instruction sequence to loop execution. The processing units carry out a maximum-power consuming operation by executing the maximum-power consuming program. In the maximum-power consuming operation, more circuit blocks are constantly activated compared with the normal mode, and therefore, larger power is consumed in the predetermined period than the power consumption in the normal mode.

When the functional modules (IP_B0, IP_B1) make the transition to the power consuming mode, the functional modules carry out a maximum-power consuming operation set in advance. This can be realized by, for example, executing the contents having the heaviest processing load among the processes which can be carried out by the functional modules. However, if such a process requires the communication with the other LSI, a particular operation mode described below is provided therein, and the maximum-power consuming operation is carried out by making the transition to the operation mode.

Figure 35:
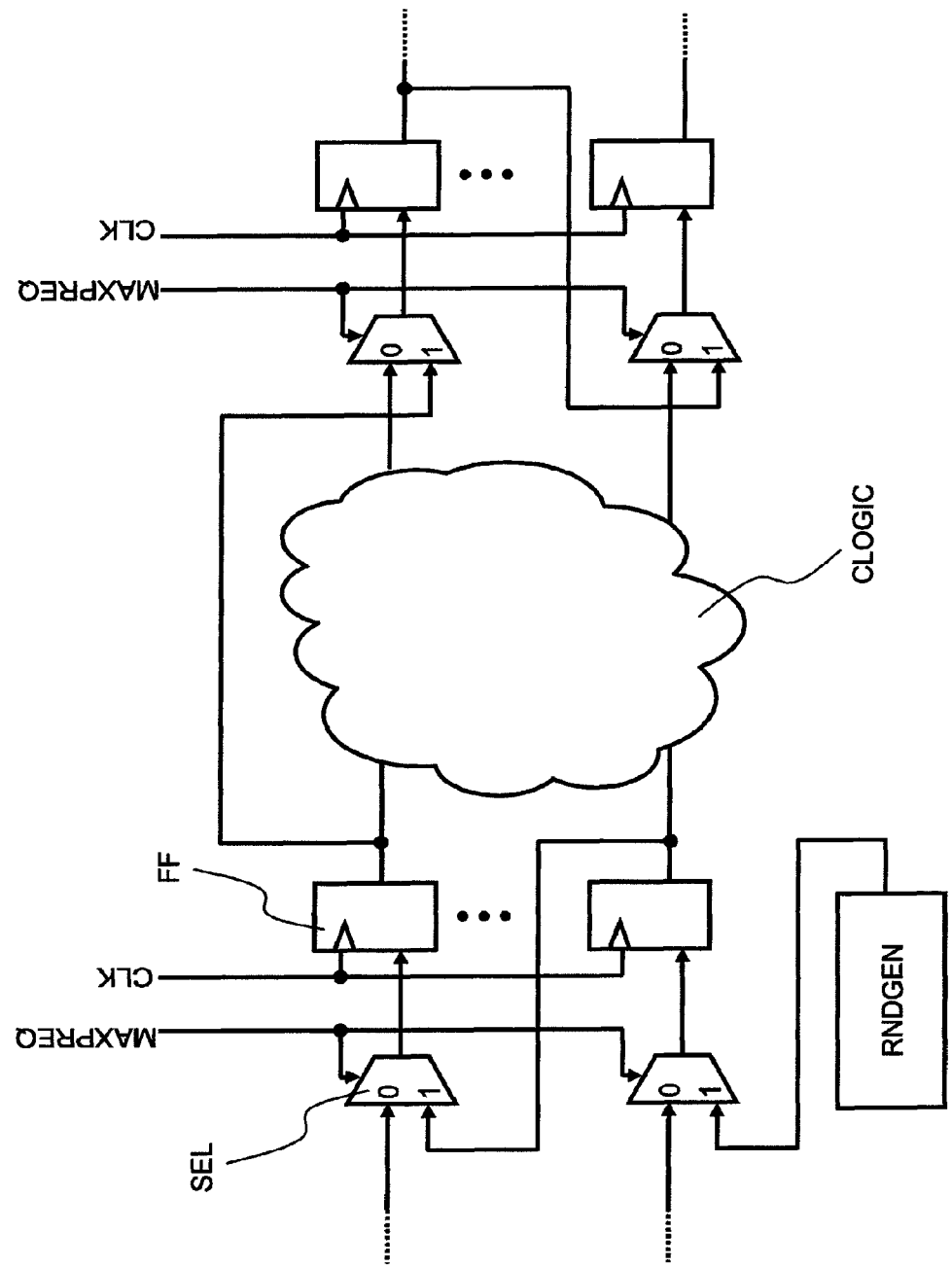
FIG. 35 is a schematic drawing showing part of the circuit structure for simulating the maximum power in the mounted functional block in the semiconductor device according to the present invention.

An embodiment of the particular operation mode for carrying out the maximum-power consuming operation provided in the functional modules will be described. In FIG. 34, when IP_B0 or IP_B1 is a functional block that requires communication with another LSI such as an Ethernet interface block that communicates with the outside of the stacked LSIs, whether an Ethernet interface of the receiving side is in a receivable state or not is unknown, and whether the communication path to external input/output pins via the communication interface 3DIC or others is operating is unknown. Therefore, the operation to consume maximum power cannot be carried out in the above-described method in which normal communication is carried out. In this case, the operation to consume maximum power is simulated by, for example, activating all or most of included flip-flops. This is realized by the following method. FIG. 35 is a schematic drawing showing part of the circuit structure for simulating the maximum power in such a functional block.

In FIG. 35, FF is a flip-flop, CLOGIC is a circuit block composed by a combination logic, RNDGEN is a pseudo random number generator, and SEL is a selector circuit which selects an output from two inputs in accordance with a control signal. MAXPREQ is the above-described power-consuming-mode transition request signal, and CLK is an operation clock signal. When MAXPREQ is negated, in other words, in normal operation, the signals output in every cycle of the operation clock signal CLK from each of the flip flops FF are computed by the combination logic CLOGIC and input to the flip flop FF of the next stage. At this point, if the circuit part which has not made signal transition or the circuit block which has not been used for computation is present, the power consumption of the entire functional module IP_B0 is not maximized. On the other hand, when MAXPREQ is asserted, in other words, in the power consuming mode, the output of each of the flip-flops FF is directly connected to the input of the adjacent flip-flop, and the entire flip-flops FF form one chain-like configuration. Also, a starting point of the flip-flop chain is connected to the pseudo random number generator RNDGEN. In this power consuming mode, random number sequences are sequentially input to the flip-flop chain in every cycle of the operation clock signal CLK, and all of or most of the flip-flops FF and the combination logic circuit CLOGIC are put into the state in which signals always make the transition. Since the power required for clock supply for flip-flop operations and the power required for signal transitions of the combination logic circuit CLOGIC account for the large part of the power consumption in the functional module, when operation by the random numbers is carried out in this manner by the flip-flop chain, the entire IP_B0 is activated, and the operation in which the power consumption is maximized can be simulated.

The power consumption in the state in which most of the flip-flops FF are activated in this manner is larger in many cases than the power consumption of the normal operation of the functional block, but since the functional block can be forcibly caused to be in the state of the power consuming operation, a test having high certainty from the viewpoint of the inspection of power supply can be carried out. Note that the configuration of connecting the flip-flops like a chain is often incorporated by conventional LSI test design, and the configuration can be constituted by utilizing that. Also, the operation of simulating the maximum power consumption by utilizing the flip-flop chain may be applied to the processing units PU_B0 to PU_B3.

When all of the functional blocks PU_B0 to PU_B3, IP_B0, and IP_B1 mounted in LSI_B carry out the operation to maximize the power consumption in the above-described manner, LSI_B becomes a maximum-power consumed state. At this point, the communication between the stacked LSIs via 3DI does not occur.

As described above, the stacked LSIs according to the present invention are characterized by having the operation mechanism that realizes the state in which LSI_B supplied with power via the through silicon vias consumes the maximum power among the operations carried out by LSI_B without accessing another LSI or the outside of the package.

A method of determining defective connection of the power-supply through silicon vias by using this operation mechanism in the stacked LSIs according to the present embodiment will be described below.

In FIG. 33, in the supply path of the power-supply potential from the outside of the stacked LSIs to LSI_B via PKCB and TSV_VDD on LSI_A, parasitic resistance determined by, for example, the specific resistance value of TSV_VDD is present. Due to this parasitic resistance, the power-supply potential of LSI_B drops from the potential provided from the outside of the stacked LSIs in accordance with the amount of the current which flows on the power-supply path in the operation of LSI_B. When it becomes lower than a predetermined power-supply potential determined by LSI, a malfunction caused by reduction in the switching speed of a transistor occurs, or the failure that the transistor does not normally switch occurs. For this reason, the power consumed by LSI_B is estimated in designing and a large number of TSV_VDD are provided so that the drop in the power-supply potential becomes sufficiently small. Therefore, the power-supply potential of LSI_B in operation increases to a predetermined value.

In this case, if disconnection or contact failure has occurred in part or all of TSV_VDD which supplies power to LSI_B, the parasitic resistance value of the power-supply path increases, and the potential becomes lower than the predetermined power-supply potential estimated in designing. In other words, if the power-supply potential is higher than a predetermined value in the operation of LSI_B, it can be determined that disconnection or contact failure does not occur in the power-supply through silicon via, or even if it has occurred, it does not affect the operation of LSI_B. Therefore, in the stacked LSIs according to the present embodiment, the fault of the power-supply through silicon via is tested by determining whether the power-supply potential of LSI_B has been increased to the predetermined value or not with a voltage monitor in the state in which the power of LSI_B is maximized by the maximum-power consuming mechanism, in other words, in the state in which the maximum current is flowing in the power-supply path to LSI_B.

On the other hand, even when the power-supply potential on LSI_B has been averagely increased to the predetermined power-supply potential, temporary or local voltage drop is caused by the operation of a particular part of the circuit, and LSI_B malfunctions in some cases. It is difficult in many cases to implement the voltage monitor that measures such temporary or local voltage drop. Therefore, in the stacked LSIs according to the present embodiment, in order to determine whether a malfunction of the circuit has occurred due to occurrence of such temporary or local voltage drop in the state of the maximum-power consuming operation, a delay monitor which determines whether a logical path (critical path) having the strictest timing constraints among the circuits mounted in LSI_B is normally operating or not is further provided. Normally, in the stage before stacking the semiconductor integrated circuits LSI, an operation test is carried out for each single semiconductor integrated circuit LSI to confirm that no operation fault occurs. Therefore, if a malfunction occurs in the critical path in LSI_B in the state in which the maximum-power operating mechanism is working, it is assumed that the cause thereof is the defective connection that has occurred in the through silicon via which supplies power to LSI_B in the stacking process. The delay monitor may be provided in accordance with needs and is not required if operation faults can be detected only with the voltage monitor. Reversely, tests can be carried out with the delay monitor just based on whether the critical path is normally operating, and in this case, only the delay monitor may be provided.

When the power-supply potential of LSI_B and the operation of the critical path are checked in this manner, the test of defective connection in the power-supply through silicon via of LSI_B can be carried out. It goes without saying that LSI_C also has similar characteristics.

Figure 36:
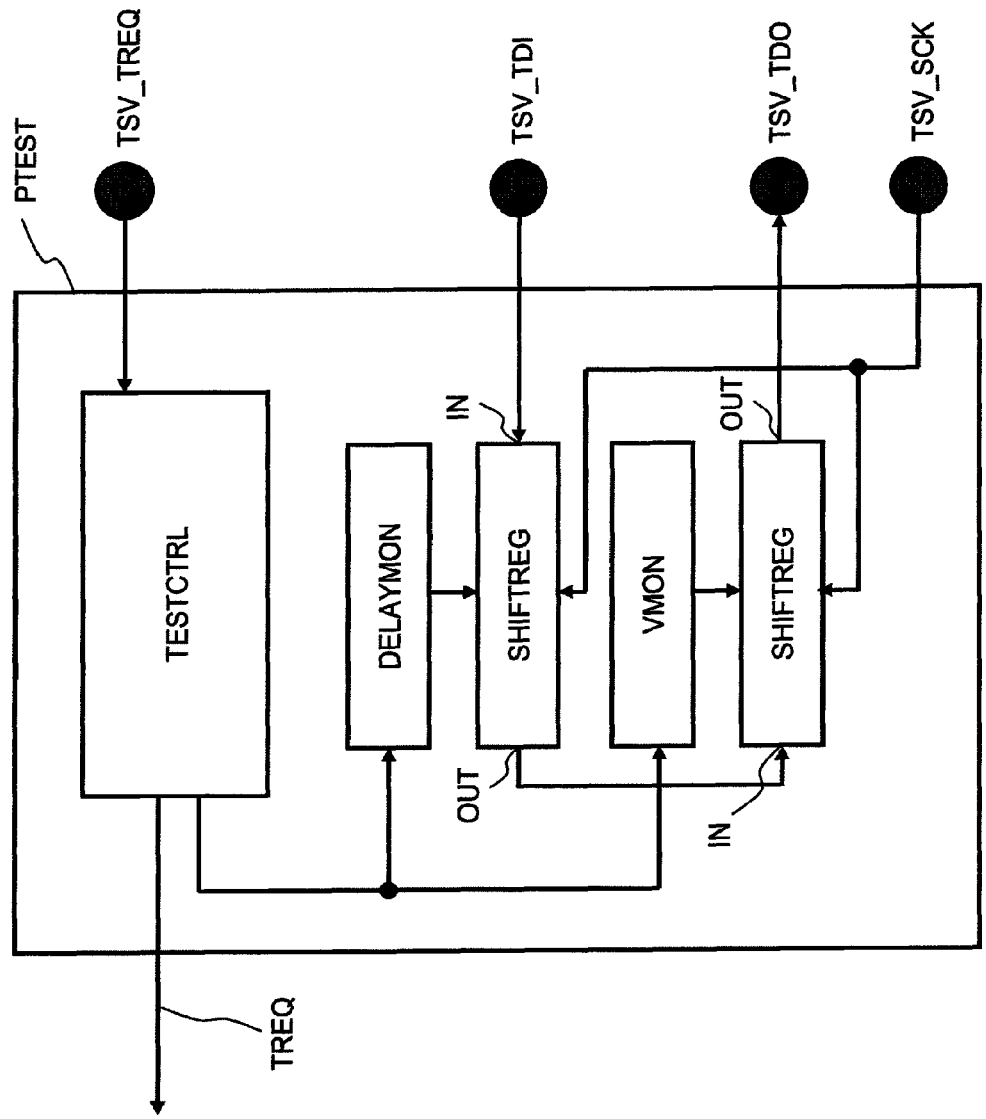
FIG. 36 is a schematic drawing showing an embodiment of the configuration of the functional block which carries out the power-supply test in the semiconductor device according to the present invention.

FIG. 36 shows an embodiment of the configuration of PTEST, which carries out the power-supply test of LSI_B in FIG. 34. In FIG. 36, PTEST is provided with a power-supply-test control block TESTCTRL, a delay monitor DELAYMON, a voltage monitor VMON, and shift registers SHIFTREG which retrieve the internal values of DELAYMON and VMON, respectively. TSV_TREQ, TSV_SCK, TSV_TDI, and TSV_TDO represent the same signals as those shown in FIG. 34.

The power-supply-test control block TESTCTRL is a functional block which controls the start/end of the power-supply test. The power-supply test requires the check of the power-supply potential and the circuit operation as described above. First, when TSV_TREQ is asserted, TEST_CTRL asserts the test request signal TREQ. At the same time, TEST_CTRL activates the delay monitor DELAYMON and the voltage monitor VMON to measure the operating state of LSI_B.

If a periodic cycle signal is not input from TSV_SCK, each of the shift registers SHIFTREG records the value input from the connected monitor block (delay monitor DELAYMON or voltage monitor VMON) in the register therein. On the other hand, when the periodic cycle signal is input from TSV_SCK, the shift register SHIFTREG shifts the value of the register therein to the higher order by one bit, outputs the most significant bit to an OUT terminal, and gives the value input from an IN terminal to the least significant bit.

The voltage monitor VMON is a block which measures the voltage supplied into LSI_B. This is composed by combining, for example, a ring oscillator, a counter circuit and others. The voltage monitor VMON operates in the following manner. First, in the shift register SHIFTREG connected to the voltage monitor VMON, the largest voltage value which can be measured by the voltage monitor VMON is recorded in advance before measurement. The voltage monitor VMON in the measurement operation periodically measures the voltage value of LSI. Then, the measured value and the value (recorded value) recorded in the shift register SHIFTREG connected to the voltage monitor VMON are compared with each other, and if the measured value is lower than the recorded value, the measured value is recorded in the shift register SHIFTREG. Thus, when the measurement operation is finished, the state that the smallest voltage value in the measurement operation period is recorded in the shift register SHIFTREG is obtained.

The delay monitor DELAYMON is a block which determines whether the logical path (critical path) having the strictest timing constraints among the circuits mounted in LSI_B normally operates or not. This is made up of, for example, a circuit configuration which imitates the critical path and a circuit which determines the correctness/incorrectness of the operation results thereof. If incorrectness occurs in the operation results of the critical path imitating circuit even once during a measurement operation period, the delay monitor DELAYMON records the occurrence of incorrect delay in the connected shift register SHIFTREG. If the supplied voltage value of the mounted LSI is reduced to cause a malfunction of the LSI, the cause thereof is mostly the malfunction of the critical path. Therefore, the malfunction due to a power-supply fault of LSI_B can be inspected by determining the incorrect delay of the critical path imitating circuit.

As described above, in addition to the control of the start and end of the power-supply test, the measurement of the voltage value of the mounted LSI in the test period and the inspection of the malfunction affected by the power-supply fault can be carried out by PTEST.

Figure 37:
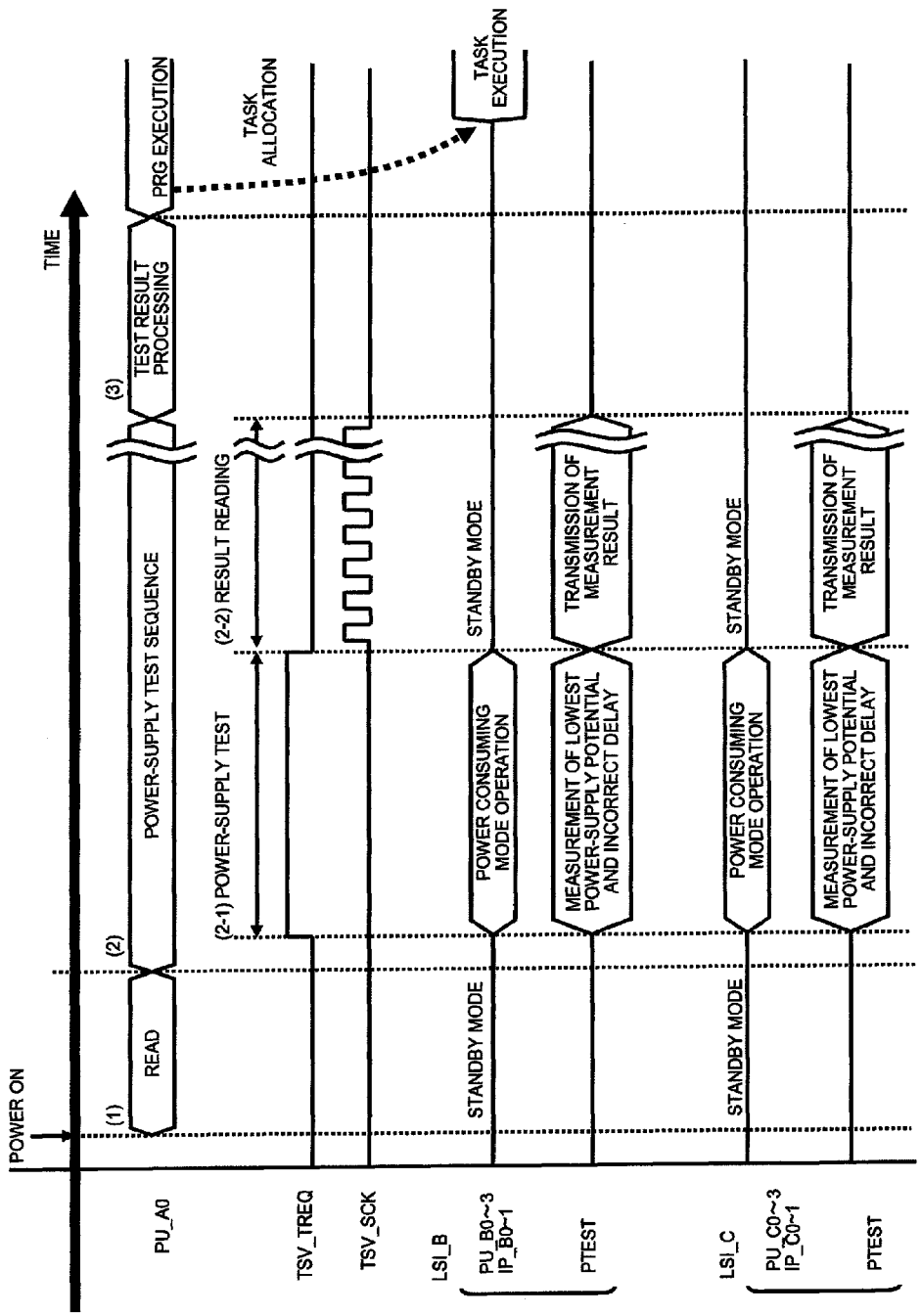
FIG. 37 is a drawing showing the procedure of the power-supply test in the semiconductor device according to the present invention.

FIG. 37 shows an aspect of the procedure of the power-supply test of the stacked LSIs in FIG. 33. This aspect is a procedure for executing the power-supply test at the time of activation of the stacked LSIs. The procedure of the test is separated into three stages of: (1) read of the power-supply test program by PU_A0; (2) execution of the power-supply test program by PU_A0; and (3) processing of the power-supply test results.

First, in (1), when power is supplied to the stacked LSIs (power on), the processor units (PU_B0 to PU_B3, PU_C0 to PU_C3) and the functional modules (IP_B0, IP_B1, IP_C0, IP_C1) mounted on LSI_B and LSI_C become a standby state, and only PU_A0 mounted on LSI_A starts operating. The standby state of LSI_B and LSI_C mentioned here refers to the state in which the operation of LSI_A and the operation of PTEST mounted on each of LSI_B and LSI_C are not disturbed. Specifically, the states to stop the actual operations such as clock-supply stop and power-supply shutdown are desirable. This is because these are the states that do not particularly depend on the quality of the power-supply through silicon vias.

When PU_A0 starts operation, the power-supply test program PTESTPROG is read from the external non-volatile memory NVRAM via the local bus controller LBSC on LSI_A. The read mentioned here is not particularly limited to loading of the program to an internal memory or a main memory, but means that an address indicated by a program counter of PU_A0 is set to PTESTPROG.

Then, in (2), PU_A0 executes the power-supply test program. First, PU_A0 controls PTEST_CTRL via the on-chip interconnect OCI_A and starts the power-supply test sequence shown in subsequent (2-1) and (2-2).

In (2-1), when the power-supply test sequence is started, PTEST_CTRL asserts the TSV_TREQ signal. The TSV_TREQ signal propagates to PTEST provided in stacked LSI_B and LSI_C via the through silicon vias. As a result, as described above, the processing units (PU_B0 to PU_B3 or PU_C0 to PU_C3) and the functional modules (IP_B0 and IP_B1 or IP_C0 and IP_C1) mounted on LSI_B and LSI_C make the transition to the power consuming mode, and at the same time, measurement of the power-supply potential and malfunction inspection are started in PTEST on each LSI. This state is referred to as a power-supply test, and the power-supply test is carried out continuously for a predetermined period determined by the power-supply test program. Herein, the power-supply tests of LSI_B and LSI_C are preferably executed in parallel. This is because power is supplied to LSI_B and LSI_C by the through vias, not to mention the test time can be shortened. More specifically, since the power supply source for LSI_B and LSI_C is the same, if LSI_B consumes large power, a voltage drop may occur in the through via that supplies power to LSI_C. On the other hand, as described above, even when a contact failure or a disconnection fault is present in some of the power-supply TSVs, sufficient power can be sometimes supplied by the other normal TSVs. Therefore, if the test is individually carried out for LSI_B or LSI_C, sufficient power may be supplied via the other normal power-supply TSVs, and it may pass the test even when the malfunction has occurred therein. However, in normal operation, LSI_B and LSI_C are operated in parallel in many cases. Therefore, the test that takes into account the power consumption in each LSI can be carried out by testing LSI_B and LSI_C in parallel in the power consuming mode.

Then, in (2-2), PU_A0 reads the results of the power-supply test. Herein, PU_A0 first controls PTEST_CTRL to negate the TSV_TREQ signal. As a result, the processing units (PU_B0 to PU_B3 or PU_C0 to PU_C3) and the functional modules (IP_B0 and IP_B1 or IP_C0 and IP_C1) mounted on LSI_B and LSI_C returns from the power consuming mode to the original state (standby state). Subsequently, PU_A0 controls PTEST_CTRL to generate the periodic cycle signal in TSV_SCK. TSV_SCK propagates to PTEST provided in stacked LSI_B and LSI_C via the through silicon via. As a result, as shown in FIG. 36, the values recorded in the shift register SHIFTREG in each PTEST are serially output to PTEST_CTRL of LSI_A one bit at a time via TSV_TDI and TSV_TDO. More specifically, PU_A0 continues the periodic cycle signal for a predetermined period, whereby the lowest power-supply potentials and the delay incorrectness determination results of stacked LSI_B and LSI_C inspected by PTEST can be read to PTEST_CTRL sequentially from the LSI in the lower layer. When the results recorded in the shift registers SHIFTREG are sequentially read like a chain in this manner, the number of the through silicon vias used in the power-supply test can be reduced. Furthermore, since the test results can be read in the order of stacking, the results of LSI_B can be retrieved even in the case where LSI_C is not operating due to a power-supply fault of the through silicon vias as shown in FIG. 33. Also, in the serial bit sequence to be read, the part in which the test results of each LSI are recorded is spontaneously determined by the order of stacking. Therefore, although details will be described later in (3), the process of associating the test results with each LSI can be carried out by LSI_A alone.

In (3), PU_A0 carries out an analyzing process of the test results read to PTEST_CTRL. As described above, in the read bit sequence, the power-supply measurement values and the delay incorrectness determination results of the critical path of the LSIs are stored in the order of stacking. PU_A0 analyzes, for each LSI, the case where the power-supply measurement value is equal to or smaller than a predetermined threshold value and the case where incorrect delay has occurred, and if either one of the cases has occurred, PU_A0 determines that the processing units and the functional modules mounted on the LSI are unusable. The result of analyzing process is recorded in the test result table RSLT_TBL in PTEST_CTRL.

In FIG. 37, the periods in which the process of (2-2) and the process of (3) are carried out are clearly separated, but the present invention is not limited thereto. Specifically, when the process of (3) is carried out in parallel with (2-2), the storage region for storing the test results in PTEST_CTRL can be reduced, and reduction in processing time can also be expected by the parallel operation.

Through the above-described procedure, usable ones among the processing units and the functional modules mounted on the stacked LSIs are recorded in the test result table RSLT_TBL. FIG. 38 shows an example of the recording format of the test result table RSLT_TBL. Like the table shown in FIG. 38, if the processing units and the functional modules are usable, the corresponding bits thereof in the test result table RSLT_TBL are recorded as "1", and if unusable, the corresponding bits are recorded as "0".

In FIG. 37, after the power-supply test is carried out at the time of activation of the stacked LSIs, a normal program is executed. In this aspect, PU_A0 manages tasks of the entire stacked LSIs and allocates the tasks to the usable processing units and functional modules with reference to the test result table RSLT_TBL. The tasks mentioned here means general processes executed by the processing units or the functional modules.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in FIG. 34, the LSIs having different configurations are used for LSI_A and LSI_B, but the case where all the stacked LSIs have the same configuration is also assumed. In this case, PTEST_CTRL provided with an input pad is mounted on each LSI in advance. This PTEST_CTRL is configured to be in an inactive state when nothing is connected to the input pad and to be in an active state only when the ground potential is applied thereto. After the LSIs are stacked, only in the LSI of the lowermost layer, that is, the LSI connected to the package substrate PKCB, the ground potential is applied to the input pad connected to PTEST_CTRL by wire bonding or the like to activate PTEST_CTRL, and the input pads connected to PTEST_CTRL on the other LSIs are released and inactivated. When such a configuration is employed, it becomes possible to operate PTEST_CTRL only in the LSI of the lowermost layer, and the power-supply test can be carried out without changing the test procedure shown in FIG. 37.

FIG. 36 shows the state in which one voltage monitor VMON and one delay monitor DELAYMON are mounted on PTEST. However, a plurality of voltage monitors VMON or delay monitors DELAYMON may be mounted on PTEST. Generally, power-supply variation is different at the locations on LSI. Therefore, the influence caused by faults in the power-supply through silicon vias can be more precisely tested by mounting a plurality of voltage monitors VMON and delay monitors DELAYMON and measuring the power-supply potential and incorrect delay at many locations on the mounted LSI. As a matter of course, a plurality of shift registers SHIFTREG connected to the voltage monitors VMON and the delay monitors DELAYMON are also mounted. Also in this case, by connecting the shift registers SHIFTREG like a chain, the power-supply test can be carried out without changing the test procedure shown in FIG. 37.

In the test procedure of FIG. 37, the power-supply test of the stacked LSIs is carried out by executing the power-supply test program by PU_A0 on LSI_A, but the present invention is not limited thereto. For example, the power-supply test program can be executed by directly controlling PTEST_CTRL via TAP in FIG. 34 by using an external debugger or an external tester. By this means, it becomes unnecessary to connect the non-volatile memory NVRAM to the stacked LSIs. Therefore, the power-supply test can be carried out at the timing such as after packaging in the manufacture, and the reduction in test cost is expected.

Embodiment 2-2

Next, the case where a fault caused by short-circuit has occurred in the power-supply through silicon via in FIG. 33 will be mentioned. Specifically, this corresponds to a fault in which electrical connection is made between TSV_VDD or between TSV_VSS in FIG. 33.

Figure 39:
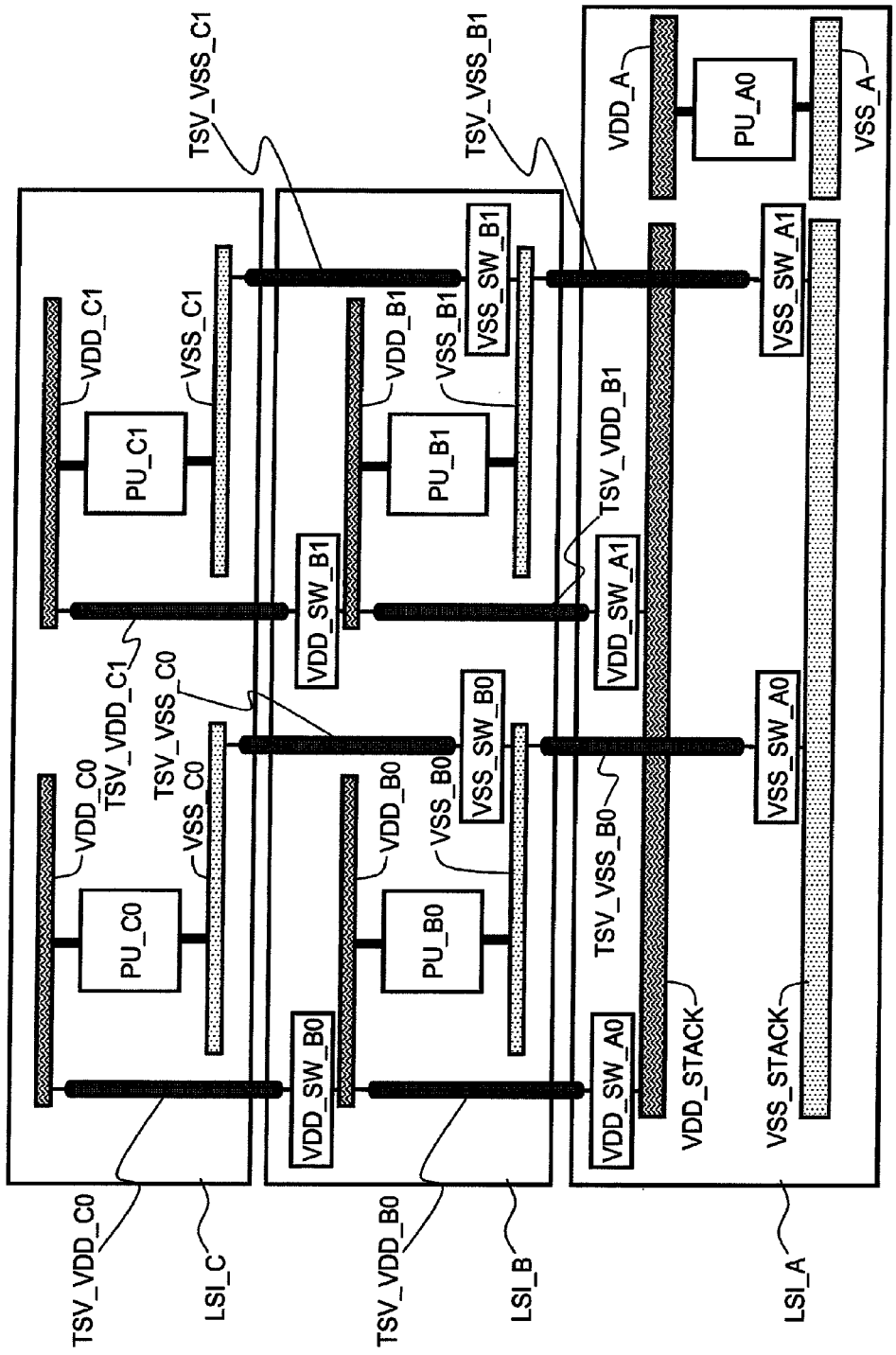
FIG. 39 is a circuit drawing showing the configuration of the power supply in the semiconductor device according to the present invention.

FIG. 39 is a configuration drawing schematically showing an embodiment of the power-supply configuration in the stacked LSIs according to the Embodiment 2 of the present invention.

Hereinafter, in the description of FIG. 39, the part described as "**" will represent all of the symbols shown by A0, B0, and others.

Each of VDD_SW_A0, VDD_SW_A1, VSS_SW_A0, VSS_SW_A1, VDD_SW_B0, VDD_SW_B1, VSS_SW_B0, and VSS_SW_B1 is a conduction switch which controls the conduction/shut-off between two terminals and is composed by, for example, the combination of a MOS transistor switch and a control circuit.

VDD_A is the wiring which applies the power-supply potential in LSI_A, and VSS_A is the wiring which applies the ground potential in LSI_A. VDD_STACK is the wiring which is disposed on LSI_A and applies the power-supply potential to the LSI stacked above LSI_A, and VSS_STACK is the wiring which is disposed on LSI_A and applies the power-supply potential to the LSI stacked above LSI_A. Though not shown in the drawing, the power-supply potential and the ground potential are supplied from the outside to VDD_A and VDD_STACK and VSS_A and VSS_STACK, respectively, via the package substrate PKCB. In the case where the power-supply wiring of PU_A0 and the wiring which applies power to the stacked LSIs are separated from each other in this manner, even if short-circuit occurs in the power-supply through silicon vias due to a fault in through silicon via formation, only PU_A0 can be operated. Also, though FIG. 39 shows only PU_A0, all the functional blocks mounted on LSI_A are configured to use VDD_A and VSS_A as power-supply wirings.

VDD_B0 is the wiring which applies the power-supply potential to PU_B0 in LSI_B, and VSS_B0 is the wiring which applies the ground potential to PU_B0. Similar to this correspondence relation, VDD_ is the wiring which applies the power-supply potential to PU_, and VSS_ represents the wiring which applies the ground potential to PU_.

TSV_VDD_C0 is the wiring which electrically connects VDD_C0 and VDD_SW_B0 and is formed of a through silicon via and micro bumps. Also, VDD_SW_B0 is electrically connected to VDD_B0. Similarly, TSV_VDD_C1 electrically connects VDD_C1 and VDD_SW_B1, TSV_VSS_C0 electrically connects VSS_C0 and VSS_SW_B0, and TSV_VSS_C1 electrically connects VSS_C1 and VSS_SW_B1. VDD_SW_B1 is electrically connected to VDD_B1, VSS_SW_B0 is electrically connected to VSS_B0, and VSS_SW_B1 is electrically connected to VSS_B1.

TSV_VDD_B0 is the wiring which electrically connects VDD_B0 and VDD_SW_A0 and is formed of the through silicon via and micro bumps. Also, VDD_SW_A0 is electrically connected to VDD_STACK. Similarly, TSV_VDD_B1 electrically connects VDD_B1 and VDD_SW_A1, TSV_VSS_B0 electrically connects VSS_B0 and VSS_SW_A0, and TSV_VSS_B1 electrically connects VSS_B1 and VSS_SW_A1. VDD_SW_A1 and VDD_STACK are electrically connected to each other, and VSS_SW_A0, VSS_SW_A1, and VSS_STACK are electrically connected.

The case where TSV_VDD_B0 and TSV_VSS_B0 are electrically short-circuited due to, for example, a fault in through silicon via formation will be described. In this case, if all of the conduction switches (VDD_SW_, VSS_SW_) are in the conducted state, the short-circuit of the power-supply wirings occurs in the LSIs stacked above LSI_A, and the power-supply potential is not increased to a predetermined value or an excessive current flows into the stacked LSIs. Therefore, all of PU_B0, PU_B1, PU_C0, and PU_C1 cannot be operated or consume excessive power.

In this case, if VDD_SW_A0 and VSS_SW_A0 are put in a shut-off state, power-supply short-circuit does not occur because the path to supply power is no longer present even if TSV_VDD_B0 and TSV_VSS_B0 are short-circuited. As a result, since electric potentials are not supplied to VDD_B0, VSS_B0, VDD_C0, and VSS_C0, PU_B0 and PU_C0 cannot be operated, but other PU_A0, PU_B1, and PU_C1 can be operated.

Similarly, part of the processing units of the stacked LSIs can be operated by putting VDD_SW_B1 and VSS_SW_B1 in the shut-off state if TSV_VDD_B1 and TSV_VSS_B1 are short-circuited, putting VDD_SW_C0 and VSS_SW_C0 in the shut-off state if TSV_VDD_C0 and TSV_VSS_C0 are short-circuited, and putting VDD_SW_C1 and VSS_SW_C1 in the shut-off state if TSV_VDD_C1 and TSV_VSS_C1 are short-circuited. Also, when through silicon vias such as TSV_VSS_B0 and TSV_VDD_B1 which supply the power to mutually different processing units are electrically short-circuited, it is only necessary to put either one of the pair of VDD_SW_A0 and VSS_SW_A0 and the pair of VDD_SW_A1 and VSS_SW_A1 in the shut-off state.

As described above, the stacked LSIs according to the present embodiment have the feature that, when short-circuit has occurred in the group of the through silicon vias which supply power, the stacked LSIs are recovered by putting them in the shut-off state.

In the case where the respective conduction switches (VDD_SW_, VSS_SW_) are in the conducted state in the initial state, if the short-circuit has occurred in the power-supply through silicon vias, the stacked LSIs are activated in the state where the power supply is short-circuited when the power is on. Therefore, the initial state of these conduction switches is desired to be the shut-off state. After the short-circuit test of the through silicon vias is completed, the conduction/shut-off state of each of the conduction switches is set. The procedure of this short-circuit test will be described later. In FIG. 39, each of TSV_VDD_ and TSV_VSS_ is shown as one line of wiring. However, it goes without saying that, even if it is made up of a plurality of through silicon vias and micro bumps, the short-circuit state can be similarly recovered.

Figure 40:
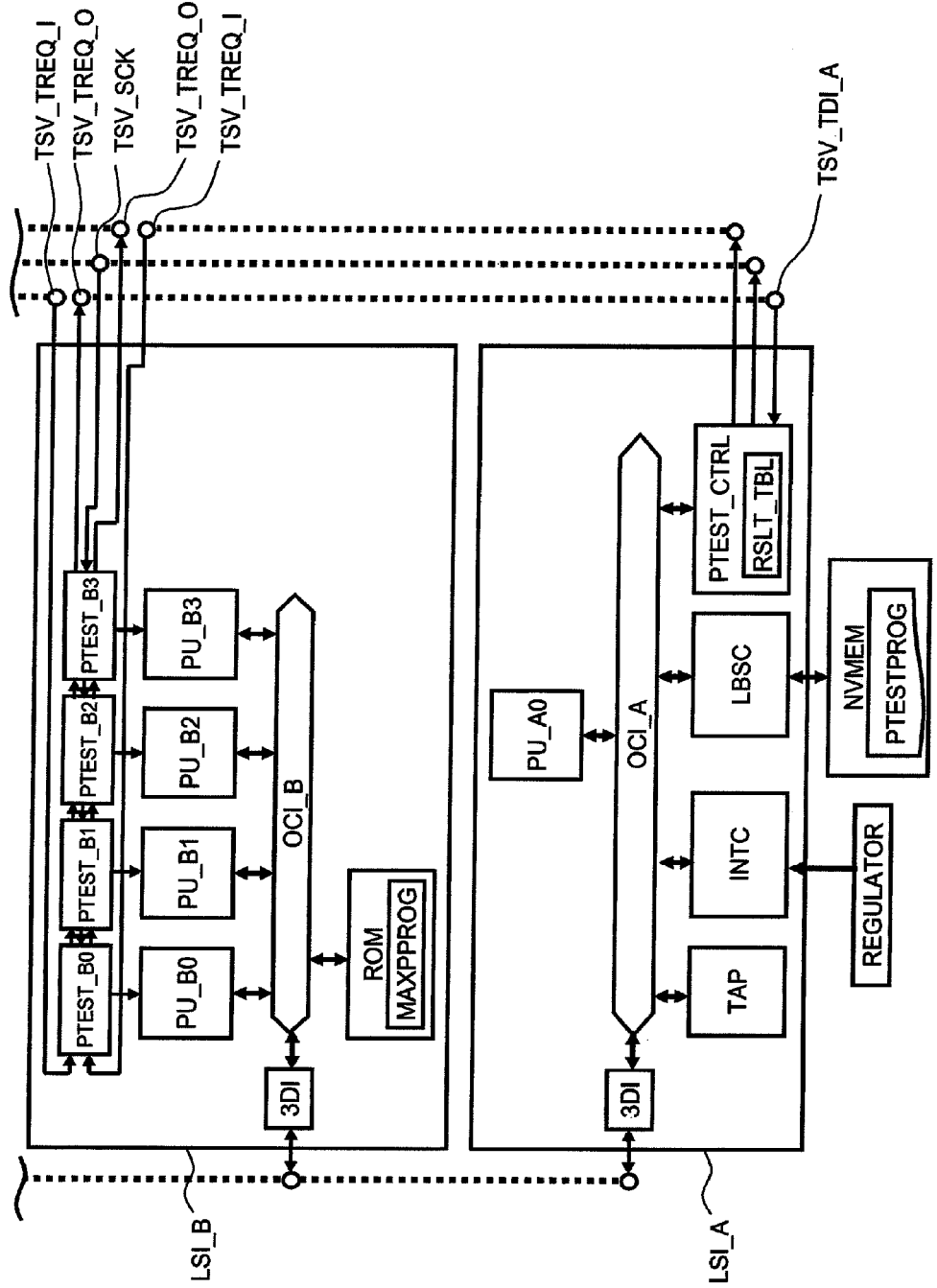
FIG. 40 is a circuit drawing showing the configuration of the main part of the semiconductor device according to the present invention.

FIG. 40 is a drawing showing an embodiment of the logical configuration and connection of the functional blocks mounted on LSI_A and LSI_B in FIG. 33 in the stacked LSIs according to the Embodiment 2 of the present invention, and is a drawing contrasted with FIG. 34. In FIG. 40, LSI_B is provided with four processing units PU_B0 to PU_B3, and PU_B2 and PU_B3 not described in FIG. 39 are assumed to have similar power-supply paths as PU_B0 and PU_B1 in FIG. 39. In FIG. 40, the parts corresponding to FIG. 34 are denoted by the same symbols, and the detailed descriptions thereof will not be repeated. In FIG. 40, the points different from the configuration shown in FIG. 34 are as follows.

In FIG. 40, LSI_A is provided with an interrupt controller INTC, which receives an interrupt signal from a regulator REGULATOR which supplies power to the stacked LSIs from outside. When an excessive current exceeding a predetermined value flows into the stacked LSIs, the regulator REGULATOR inputs the interrupt signal to the interrupt controller INTC. As a result, PU_A0 of LSI_A can detect the occurrence of short-circuit of power supply.

Instead of PTEST and MD_CTRL, LSI_B is provided with four functional blocks PTEST_B0, PTEST_B1, PTEST_B2, and PTEST_B3 which carry out the power-supply test, and the functional blocks are connected to particular processing units, for example, PTEST_B0 is connected to PU_B0 and PTEST_B1 is connected to PU_B1.

Although the case where one power-supply test functional block is connected to each processing unit is shown here, the present invention is not limited thereto. When a plurality of processing units share the wiring to which power is supplied, it is only necessary to form the structure in which the power-supply test functional block is provided for each of the sharing groups.

Figure 41:
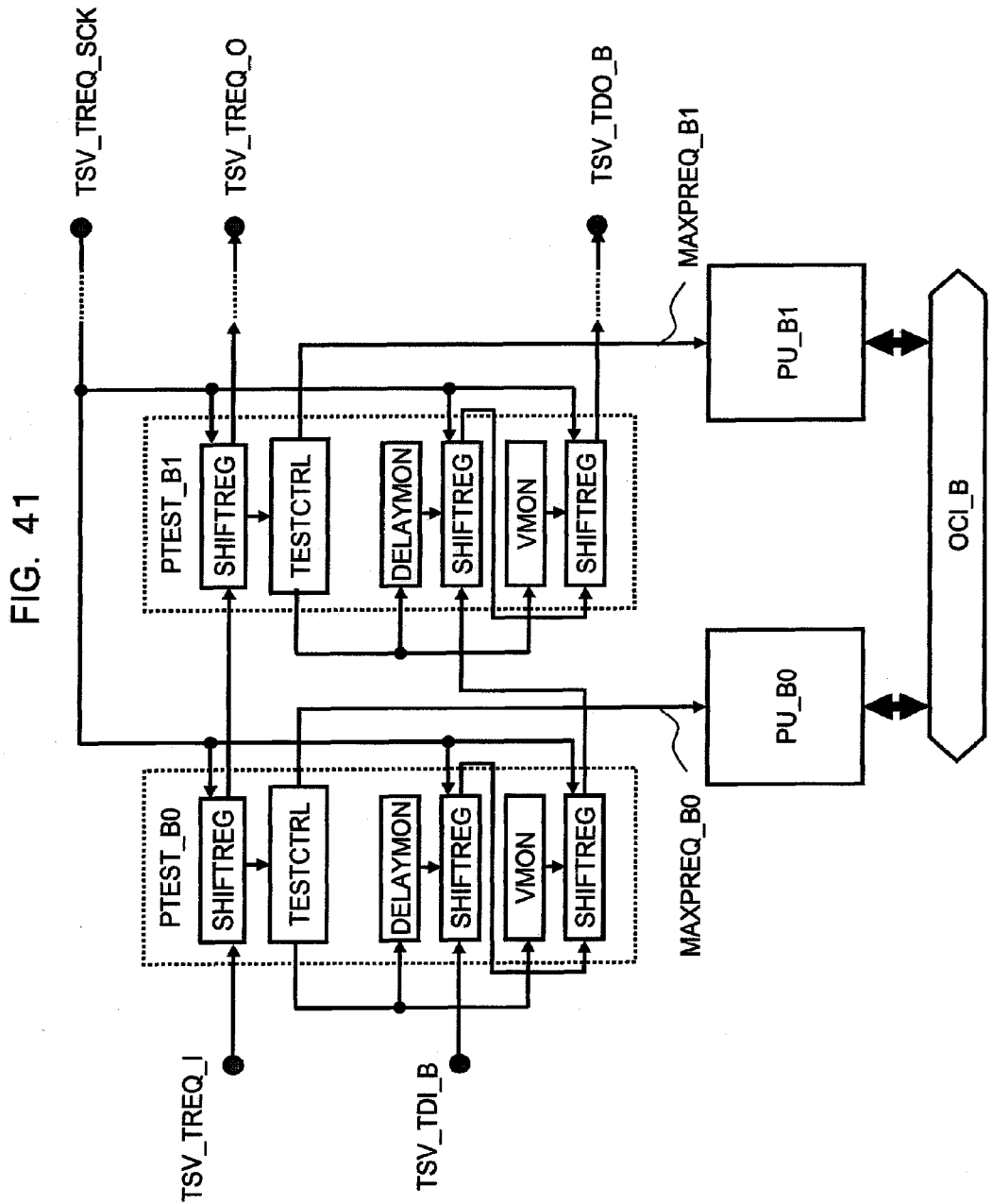
FIG. 41 is a schematic drawing showing an embodiment of the configuration of the functional block which carries out the power-supply test in the semiconductor device according to the present invention.

FIG. 41 shows the connection configuration between PU_B0, PU_B1, PTEST_B0, and PTEST_B1 in FIG. 40. The difference between PTEST shown in FIG. 36 and PTEST_B0 and PTEST_B1 lies in that a TSV_TREQ_I signal is input to a shift register SHIFTREG in PTEST_B0 and the value input to the shift register SHIFTREG is input to TESTCTRL. Also, the output of the shift register SHIFTREG of PTEST_B0 is input to the shift register of PTEST_B1. In the case where the shift registers are configured like a chain in this manner, when the periodic cycle signal is input from TSV_TREQ_SCK, the value input to TSV_TREQ_I is retrieved by the shift register SHIFTREG of PTEST_B3, and the value previously recorded in the shift register SHIFTREG in PTEST_B3 is retrieved by the shift register SHIFTREG in PTEST_B2. Similarly, the shift registers SHIFTREG which record the values of the voltage monitors VMON and the delay monitors DELAYMON are also configured like a chain. Although not shown in FIG. 41, PTEST_B2 connected to PU_B2 and PTEST_B3 connected to PU_B3 also have similar configurations, and the value of the shift register SHIFTREG in PTEST_B3 propagates by the periodic cycle signal of TSV_TREQ_SCK to LSI_C, which is stacked thereabove, via TSV_TREQ_O or to LSI_A, which is stacked therebelow, via TSV_TDO_B.

Also, in accordance with the value of the connected shift register SHIFTREG, TESTCTRL in PTEST_B0 switches assert/negate of a power-consuming-mode transition request signal MAXPREQ_B0 with respect to the connected processing unit PU_B0. More specifically, when the value in the shift register SHIFTREG is "1", the power-consuming-mode transition request signal MAXPREQ_B0 is asserted with respect to the processing unit PU_B0. As a result, PU_B0 makes the transition to the power consuming mode described in the Embodiment 1. This configuration is similar also in PTEST_B1.

In the above-described configuration, by inputting a predetermined bit sequence from TSV_TREQ_I in correspondence with the periodic cycle signal of TSV_TREQ_SCK, an arbitrary combination of the processors of the processing units PU_B0 to PU_B3 mounted on LSI_B can be operated in the power consuming mode.

Figure 42:
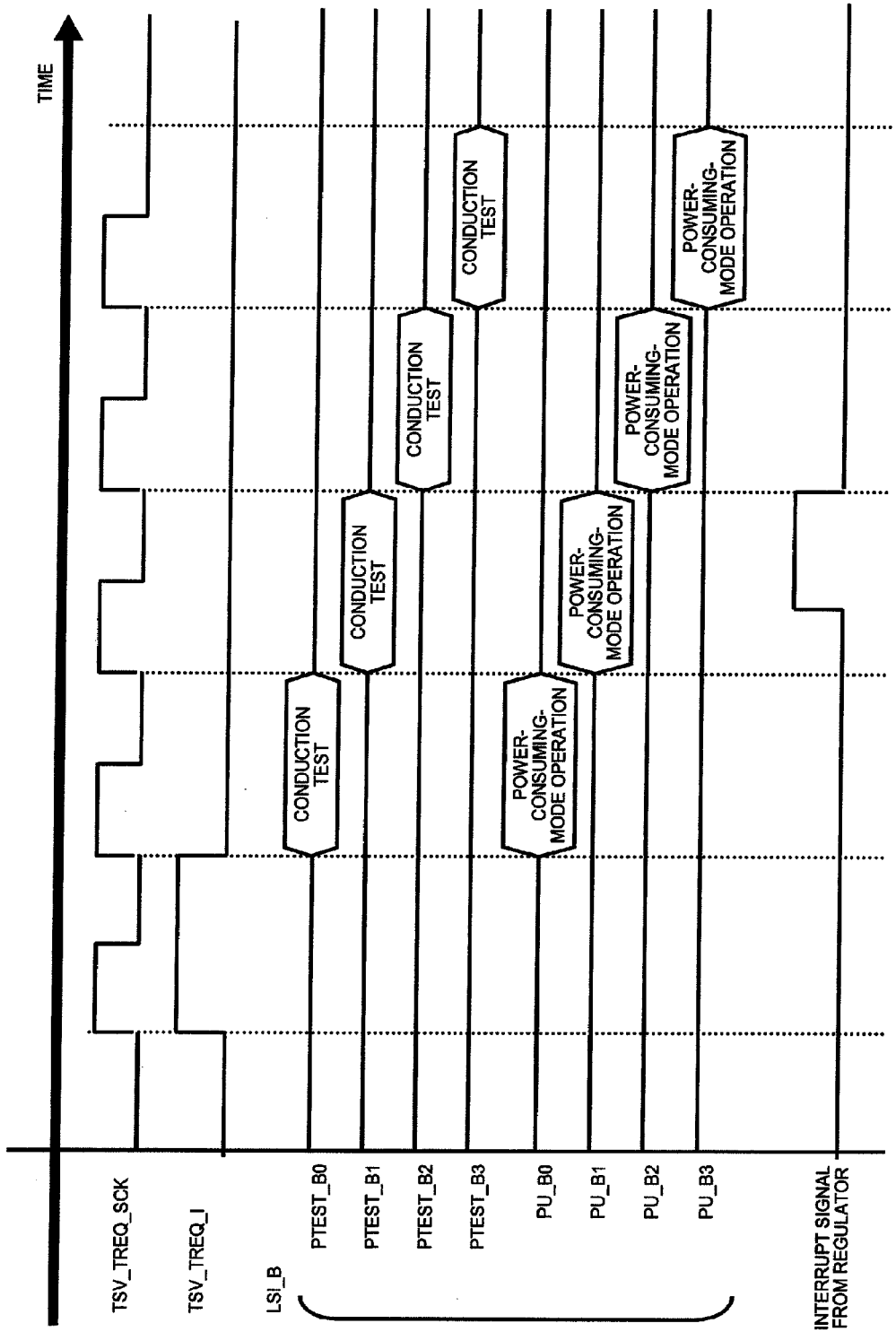
FIG. 42 is a drawing showing the procedure of the power-supply test in the semiconductor device according to the present invention.

FIG. 42 shows an example of the procedure of carrying out the short-circuit test of the power-supply through silicon vias in LSI_B in the present embodiment. First, in the initial state, the values in the shift registers SHIFTREG in PTEST_B0 to PTEST_B3 are set to "0", and all of the power-supply switches VDD_SW_ and VSS_SW_ in FIG. 39 are set to the shut-off state. Therefore, PU_B0 to PU_B3 on LSI_B are not supplied with power and are activated in the stopped state. Accordingly, even if a short-circuit fault is present in TSV_VDD_ and TSV_VSS_, the stacked LSIs can be activated without being affected by the short-circuit fault. On the other hand, PU_A0 on LSI_A is activated in an operable state because power is supplied via VDD_A and VSS_A.

Then, the shut-off of the power-supply switches VDD_SW_A0 and VSS_SW_A0 in FIG. 39 is first released. As a result, PU_B0 is activated, and the state in which the power-supply test can be executed only in PU_B0 is achieved. At this point, in accordance with the periodic cycle signal of TSV_TREQ_SCK, "1" is input only for one cycle from TSV_TREQ_I. In the next cycle of TSV_TREQ_SCK, the signal "1" is written to SHIFTREG in PTEST_B0, and a conduction test with respect to PU_B0 is started. PTEST_B0 asserts the power-consuming mode transition request signal MAXPREQ_B0 with respect to PU_B0, and PU_B0 operates in the power consuming mode. Then, in the next periodic cycle of TSV_TREQ_SCK, SHIFTREG in PTEST_B0 makes the transition to the signal "0", SHIFTREG in PTEST_B1 makes the transition to the signal "1", the power-supply switches VDD_SW_A0 and VSS_SW_A0 in FIG. 39 are returned again to the shut-off state, and the shut-off of the power-supply switches VDD_SW_A1 and VSS_SW_A1 is released. PTEST_B0 negates the power-consuming mode transition request signal MAXPREQ_B0, and the power-consuming-mode operation of PU_B0 is finished. At the same time, PTEST_B1 asserts the power-consuming mode transition request signal MAXPREQ_B1 with respect to PU_B1 in order to carry out a conduction test, and PU_B1 operates in the power consuming mode. In this manner, in every cycle of TSV_TREQ_SCK, each one of the processing units can be operated in the power consuming mode sequentially in the order of PU_0, PU_B1, PU_B2, and PU_B3.

Through the period of these conduction tests, PU_A0 on LSI_A monitors interrupt from the regulator REGULATOR. FIG. 42 shows the state in which an interrupt signal from the regulator REGULATOR is input during the conduction-test period of PU_B1. As described above, the interrupt signal is input from the regulator REGULATOR only when an excessive current flows into the stacked LSIs. Therefore, it is possible to determine whether short-circuit has occurred in the through silicon via, which supplies power to PU_B1, and on the wiring connected thereto.

When short-circuit has occurred, PU_A0 records the fact that PU_B1 is unusable in RSLT_TBL in PTEST_CTRL, and as described in FIG. 39, it shuts off the conduction switches VDD_SW_A1 and VSS_SW_A0 connected to the through silicon vias, which supply power to PU_B1.

In the above-described manner, the semiconductor device according to the present aspect provides the short-circuit test of the power-supply through silicon vias and recovery means in the case of short-circuit occurrence.

DESCRIPTION OF REFERENCE SIGNS

CPU1-CPU8: processor, RAM1, RAM2: memory, PKCB: package substrate, LSI_A, LSI_B, LSI_C: stacked LSI, BMP: solder bump, MBMP: micro bump, TSV_VDD, TSV_VSS: power-supply through silicon via, TSV_SIG: signal through silicon via, TSV_SCK, TSV_TREQ, TSV_TDI_A, TSV_TDI_B, TSV_TDI_C, TSV_TDO_A, TSV_TDO_B, TSV_TDO_C: power-supply test signal through silicon via, PTEST: power-supply test circuit, PTEST_CTRL: power-supply test control circuit, PU_A0, PU_B0, PU_B1, PU_B2, PU_B3: processing unit, IP_B0, IP_B1: functional block, OCI_A, OCI_B: on-chip interconnect, 3DI: communication interface between stacked LSIs, TAP: test access port, LBSC: local bus controller, NVMEM: nonvolatile memory, PTEST-PROG: power-supply test program, RSLT_TBL: test result table, TREQ: test request signal, MAXPREQ: power-consuming-mode transition request signal, MD_CTRL: operation-mode controlling unit, MDREG: operation mode register, ROM: read-only memory, MAXPPROG: maximum-power consuming program, SEL: selector, FF: flip-flop, CLK: clock signal, TESTCTRL: power-supply-test control block, DELAYMON: delay monitor, VMON: voltage monitor, SHIFTREG: shift register, TSV_VDD_B0, TSV_VDD_B1, TSV_VDD_C0, TSV_VDD_C1, TSV_VSS_B0, TSV_VSS_B1, TSV_VSS_C0, TSV_VSS_C1: power-supply through silicon via, VDD_STACK, VSS_STACK: wiring applying power-supply potential to stacked LSI, VDD_A, VDD_B0, VDD_B1, VDD_C0, VDD_C1, VSS_A, VSS_B0, VSS_B1, VSS_C0, VSS_C1: power-supply wiring of each LSI, VDD_SW_A0, VDD_SW_A1, VDD_SW_B1, VDD_SW_B2, VSS_SW_A0, VSS_SW_A1, VSS_SW_B0, VSS_SW_B1: power-supply switch, PTEST_B0, PTEST_B1, PTEST_B2, PTEST_B3: power-supply test functional block

The invention claimed is:

1. A semiconductor device comprising:
a first LSI including a first processing unit and a first power-supply test circuit, the first processing unit having a normal mode and a power consuming mode;
a second LSI stacked with the first LSI and including a second processing unit and a second power-supply test circuit, the second processing unit having the normal mode and the power consuming mode; and
a power-supply through via that connects the first LSI and the second LSI and supplies an operating voltage to the first LSI and the second LSI,
wherein power consumption of the first processing unit in the power consuming mode is larger than power consumption of the first processing unit in the normal mode,
power consumption of the second processing unit in the power consuming mode is larger than power consumption of the second processing unit in the normal mode,
when the first processing unit is in the power consuming mode, the first power-supply test circuit measures a voltage value of the operating voltage supplied via the power-supply through via, and
when the second processing unit is in the power consuming mode, the second power-supply test circuit measures a voltage value of the operating voltage supplied via the power-supply through via.

2. The semiconductor device according to claim 1,
wherein a period in which the first processing unit operates in the power consuming mode is parallel with a period in which the second processing unit operates in the power consuming mode, and
a period in which the first power-supply test circuit measures the voltage value of the operating voltage and a period in which the second power-supply test circuit measures the voltage value of the operating voltage are parallel with the period in which the first processing unit and the second processing unit operate in the power consuming mode.

3. The semiconductor device according to claim 1,
wherein the first LSI further includes a first memory that stores a maximum-power consuming program executed by the first processing unit in the power consuming mode, and
the second LSI further includes a second memory that stores a maximum-power consuming program executed by the second processing unit in the power consuming mode.

4. The semiconductor device according to claim 1,
wherein the first LSI includes a first register in which an operation mode is set,
the second LSI includes a second register in which an operation mode is set, and
the semiconductor device further includes:
a first test through via that transfers data from outside to the first register in order to set the operation mode; and a second test through via that transfers data from the first LSI to the second register in order to set the operation mode.

5. The semiconductor device according to claim 1,
wherein the first power-supply test circuit includes a first delay monitor that simulates a critical path of the first processing unit,
the second power-supply test circuit includes a second delay monitor that simulates a critical path of the second processing unit, and
the first and second delay monitors determine whether the critical paths are normally operating or not in the power consuming mode.

6. The semiconductor device according to claim 1,
wherein the first LSI further includes a first functional module having a first scan chain and a first random number generating unit connected to the first scan chain,
the second LSI further includes a second functional module having a second scan chain and a second random number generating unit connected to the second scan chain, and
the first and second random number generating units send random numbers to the first and second scan chains in the power consuming mode.

* * * * *